United States Patent
O'Brien et al.

(10) Patent No.: US 11,348,970 B2
(45) Date of Patent: May 31, 2022

(54) SPIN ORBIT TORQUE (SOT) MEMORY DEVICE WITH SELF-ALIGNED CONTACTS AND THEIR METHODS OF FABRICATION

(71) Applicant: Intel Corporation, Santa Clara, CA (US)

(72) Inventors: Kevin O'Brien, Portland, OR (US); Benjamin Buford, Hillsboro, OR (US); Kaan Oguz, Portland, OR (US); Noriyuki Sato, Hillsboro, OR (US); Charles Kuo, Hillsboro, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 892 days.

(21) Appl. No.: 15/960,218

(22) Filed: Apr. 23, 2018

(65) Prior Publication Data
US 2019/0326353 A1    Oct. 24, 2019

(51) Int. Cl.
| H01L 27/22 | (2006.01) |
| H01L 43/02 | (2006.01) |
| H01L 43/12 | (2006.01) |
| G11C 11/16 | (2006.01) |
| H01L 43/10 | (2006.01) |
| H01L 43/04 | (2006.01) |
| H01L 45/00 | (2006.01) |
| B82Y 25/00 | (2011.01) |

(52) U.S. Cl.
CPC .......... *H01L 27/222* (2013.01); *G11C 11/161* (2013.01); *H01L 27/226* (2013.01); *H01L 43/02* (2013.01); *H01L 43/04* (2013.01); *H01L 43/10* (2013.01); *H01L 43/12* (2013.01); *H01L 45/1233* (2013.01); *B82Y 25/00* (2013.01)

(58) Field of Classification Search
CPC ... H01L 27/222; H01L 43/04; H01L 45/1253; H01L 45/1233; G11C 11/161
See application file for complete search history.

(56) References Cited

U.S. PATENT DOCUMENTS

| 5,583,725 | A * | 12/1996 | Coffey | G11C 11/15 360/324.11 |
| 8,400,066 | B1 * | 3/2013 | Pileggi | G11C 11/161 315/152 |
| 2006/0027846 | A1 * | 2/2006 | Lee | B82Y 10/00 257/295 |
| 2008/0094886 | A1 * | 4/2008 | Ranjan | B82Y 10/00 365/171 |
| 2010/0027158 | A1 * | 2/2010 | Takagishi | G11B 5/314 360/77.02 |
| 2013/0314978 | A1 * | 11/2013 | Currivan | G11C 11/161 365/158 |

* cited by examiner

*Primary Examiner* — Feifei Yeung Lopez
(74) *Attorney, Agent, or Firm* — Essential Patents Group, LLP

(57) ABSTRACT

A spin orbit torque (SOT) memory device includes an SOT electrode on an upper end of an MTJ device. The MTJ device includes a free magnet, a fixed magnet and a tunnel barrier between the free magnet and the fixed magnet and is coupled with a conductive interconnect at a lower end of the MTJ device. The SOT electrode has a footprint that is substantially the same as a footprint of the MTJ device. The SOT device includes a first contact and a second contact on an upper surface of the SOT electrode. The first contact and the second contact are laterally spaced apart by a distance that is no greater than a length of the MTJ device.

24 Claims, 20 Drawing Sheets

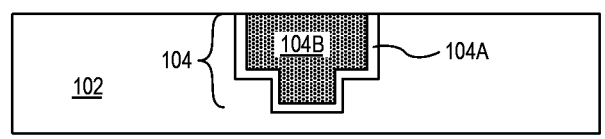
FIG. 5A
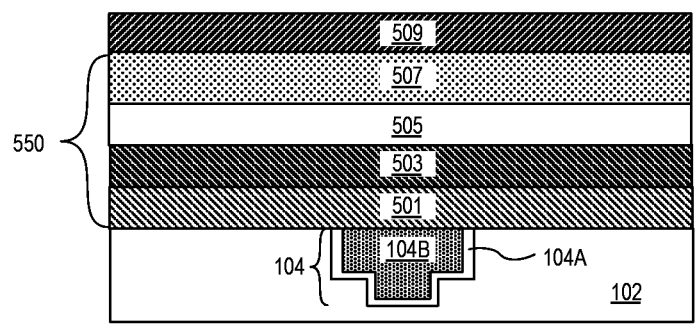
FIG.5B

SPIN ORBIT TORQUE (SOT) MEMORY DEVICE WITH SELF-ALIGNED CONTACTS AND THEIR METHODS OF FABRICATION

BACKGROUND

For the past several decades, the scaling of features in integrated circuits has been a driving force behind an ever-growing semiconductor industry. Scaling features enables increased densities of functional units on semiconductor chips. For example, shrinking transistor size allows for an incorporation of an increased number of memory devices on a chip, lending to fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, patterning of scaled SOT devices and aligning metallization structures with nanoscale SOT devices are some important areas of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 5A illustrates a cross-sectional view of conductive interconnect adjacent to a dielectric layer.

FIG. 5B illustrates a cross-sectional view of FIG. 5A following the formation of a MTJ material layer stack above the conductive interconnect and followed by the formation of a SOT layer on the material layer stack.

DESCRIPTION OF THE EMBODIMENTS

Figure 1A:
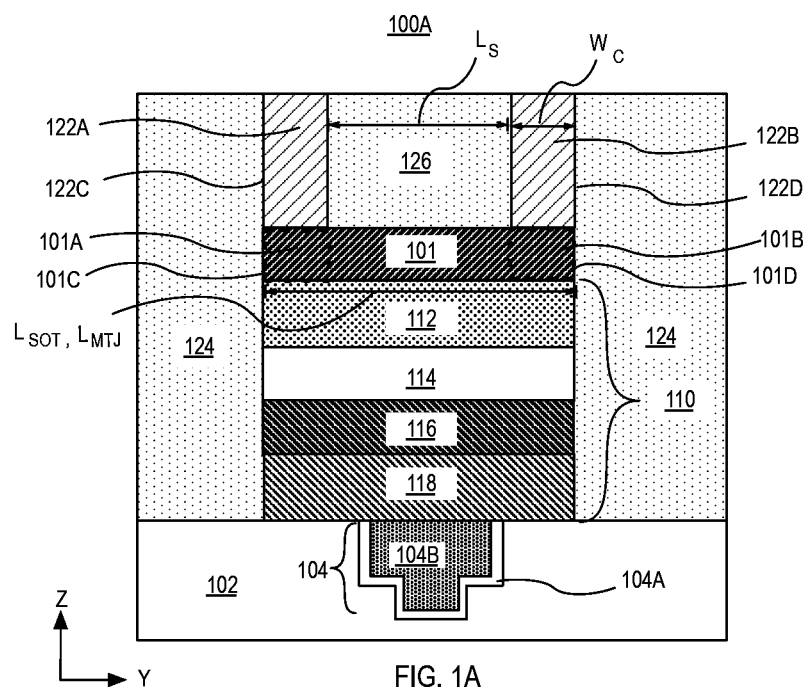
FIG. 1A is an illustration of a cross-sectional view of a SOT memory device, in accordance with embodiments of the present disclosure.

Self-aligned spin orbit torque (SOT) memory devices and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with magnetic memory devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following descriptions, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

A SOT memory device may include a magnetic tunnel junction (MTJ) device formed on an electrode including a spin orbit torque material (herein referred to as a spin orbit torque electrode). The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

Resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when there is no current flowing through the MTJ device. For this reason, the MTJ device belongs to a class of memory known as non-volatile memory.

As MTJ devices are scaled, the need for smaller memory elements to fit into a scaled cell size has driven the industry in the direction of perpendicular MTJ (pMTJ). pMTJ based memory devices have a fixed magnetic layer and a free magnetic layer each having a magnetic anisotropy that is perpendicular with respect to a plane defining an uppermost surface of the spin orbit torque electrode.

As a MTJ device is further scaled down in size, the amount of critical spin polarized current density required to switch the device increases. It may be advantageous to have an additional source of switching torque to allow a reduction in the spin polarized current density. By implementing an MTJ device on a SOT electrode, the magnetization in the free magnet can switch with a torque provided by a Spin Hall current, induced by passing an electrical current, in a transverse direction, through the SOT electrode. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Depending on the direction of an applied current, electrons of a particular spin polarity are diffused toward the free magnet of the MTJ device and impart a spin orbit torque on the magnetization of the free magnetic layer. By providing switching assistance in the form of a spin orbit torque, the Spin Hall current may help the MTJ device to switch faster. To switch a free magnetic layer having a perpendicular magnetization, an external magnetic field may be implemented to aid with magnetization reversal.

An implementation where an MTJ device is coupled with an SOT electrode may result in a three terminal SOT memory device, where two terminals are connected to at opposite ends of the SOT electrode to induce the Spin Hall current. One end of an MTJ device is coupled to the SOT electrode between these two terminals, and another end of the MTJ device is further coupled to a third terminal. The MTJ may be biased with respect to one of the two SOT electrode terminals to provide a spin transfer torque current. Such a three terminal SOT device may have an SOT electrode footprint that ranges from 5-10 times a footprint of the MTJ device.

As SOT devices are scaled, an SOT electrode having a footprint that is substantially the same as a footprint of the MTJ device is highly desirable. However, aligning a scaled SOT electrode on two conductive interconnects (for two terminals) becomes a formidable challenge with scaling. In some embodiments, the SOT electrode is above an MTJ device and adjacent to a free magnet, where the free magnet is above a fixed magnet and separated by a tunnel barrier. In some such embodiments, the SOT device includes a first contact and a second contact that are both self-aligned to the SOT electrode. The first contact and the second contact are laterally spaced apart by a distance that is no greater than a length of the MTJ device. The MTJ device below the SOT electrode may be (lithographically) aligned to a third contact. A three terminal SOT memory device as described further below may also provide device size scalability advantages, such as, reduced SOT device footprint compared to a regular three terminal SOT memory device. For example, the density of SOT memory devices per unit area may be increased by a factor of at least 2 times over a regular 3 terminal SOT memory device.

Specific embodiments are described herein with respect to a SOT memory device including a MTJ device. It is to be appreciated that embodiments described herein may also be applicable to in-plane MTJ devices including in-plane spin torque transfer memory (STTM) devices and perpendicular MTJ devices including perpendicular spin torque transfer memory (pSTTM) devices.

FIG. 1A is an illustration of a cross-sectional view of a SOT memory device 100A in accordance with an embodiment of the present disclosure. The SOT memory device 100A includes a magnetic tunnel junction (MTJ) device 110 on a conductive interconnect 104, where the MTJ device 110 includes a fixed magnet 116 above the conductive interconnect 104, a tunnel barrier 114 above the fixed magnet 116, and a free magnet 112 above the tunnel barrier 114. The SOT memory device 100A further includes an electrode 101 above the MTJ device 110 and coupled with the free magnet 112. In some embodiments, the MTJ device 110 also includes a synthetic antiferromagnetic layer 118 between the conductive interconnect 104 and the fixed magnet 116. The electrode 101 includes a spin orbit torque material (herein referred to as SOT electrode 101). As shown, the SOT electrode 101 may have substantially the same footprint as the footprint of the MTJ device 110. The SOT memory device 100 further includes a first contact 122A over, and coupled with, a first portion 101A of the SOT electrode 101. A second contact 122B is over, and coupled with, a second portion 101B of the SOT electrode 101. The contact 122A is laterally distant from the contact 122B by a spacing, $L_S$. The spacing, $L_S$, is influenced by material dependent parameter known as a spin diffusion length. In some embodiments, the spin diffusion length is between 1 nm and 10 nm. Spacing, $L_S$ is advantageously no more than a length, $L_{MTJ}$, of the MTJ device 110.

In some embodiments, the contact 122A is laterally distant from the contact 122B by an amount between 10 nm and 90 nm. In embodiments, the contact 122A and the contact 122B have a width, $W_C$, between 5 nm and 10 nm. In some embodiments, the MTJ device 110 has a length, $L_{MTJ}$, between 20 nm and 100 nm. In some examples, when a MTJ device 110 has a length, $L_{MTJ}$, that is between 20 nm and 30 nm, the contacts 122A and 122B each have a width, $W_C$, that is between 5 nm and 7 nm.

In some embodiments, the contact 122A has a sidewall 122C that does not extend beyond a sidewall 101C of the SOT electrode portion 101A and the contact 122 has a sidewall 122D that does not extend beyond a sidewall 101D of the SOT electrode portion 101B. In the illustrative embodiment, the contact sidewall 122C is substantially vertically aligned with the SOT sidewall 101C, and the contact sidewall 122D is substantially vertically aligned with the SOT sidewall 101D.

Figure 1B:
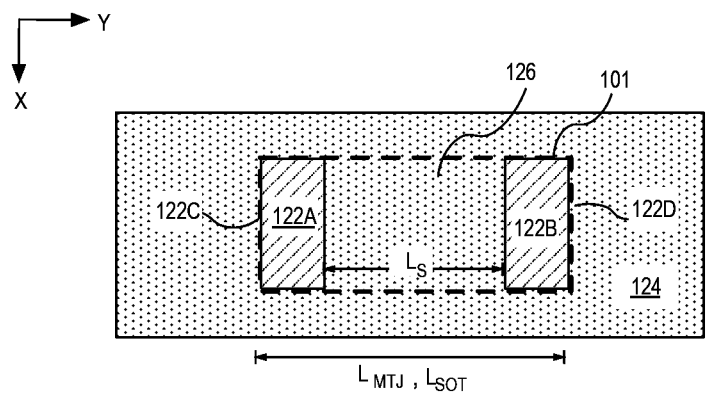
FIG. 1B illustrates a plan view of the SOT memory device of FIG. 1A.

FIG. 1B illustrates a plan view of the structure in FIG. 1A. In the illustrative embodiment, the SOT electrode 101 has a rectangular footprint. In exemplary embodiments, the contact sidewalls 122C and 122D have shapes that are substantially parallel to shape of sidewalls 101C and 101D respectively. In the illustrative embodiment, the contacts 122A and 122B have a rectangular profile.

As illustrated the contacts 122A and 122B are separated from each other by a dielectric layer 126 having a spacing, $L_S$. The contacts 122A and 122B are surrounded by dielectric layer 124 on three sides. The SOT electrode 101 may have other footprints such as circular or elliptical.

Figure 1C:
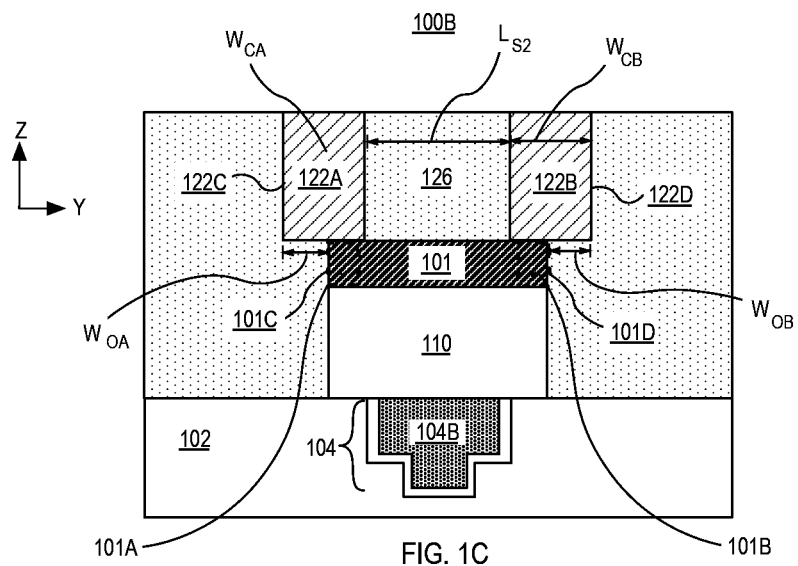
FIG. 1C is an illustration of a cross-sectional view of a SOT memory device, where a first and a second contact electrode extend beyond a sidewall of the SOT memory device.

In some embodiments, the contact sidewall 122C extends beyond the sidewall 101C of the SOT electrode portion 101A such as is shown in the cross-sectional illustration of FIG. 1C. In some embodiments, the contact sidewall 122C extends beyond the sidewall 101C by an amount $W_{OA}$, and the sidewall 122D of the contact 122 extends beyond the sidewall 101D of the SOT electrode portion 101B, by an amount $W_{OB}$. In some embodiments, the amount $W_{OA}$ is substantially the same as $W_{OB}$. In the illustrative embodiment, the contact 122A has a width $W_{CA}$, and contact 122B has a width $W_{CB}$, where $W_{CA}$ is substantially the same as $W_{CB}$. In some such embodiments, the contact sidewall 122C extends beyond the SOT electrode sidewall 101C by an amount between 25% and 50% of the contact 122A width, $W_{CA}$, and the contact 122B extends beyond the SOT electrode sidewall 101D by an amount between 25% and 50% of the contact 122B width, $W_{CB}$. In the illustrative embodiment, when the sidewalls 122C and 122D each extend beyond the SOT electrode sidewalls 101C and 101D, respectively, the spacing $L_{S2}$, between the contacts 122A and 122B is increased compared to the spacing $L_S$ depicted in FIG. 1A. An increase in $L_S$ may be advantageous for inducing transverse spin current along a plane of the SOT electrode 101 in implementations where the SOT electrode 101 has a length that approaches dimensions that are less than 30 nm.

In other embodiments, the contact 122A also extends below an uppermost surface 101E of the SOT electrode 101 adjacent to the SOT electrode sidewall 101C but, above a lowermost surface 101F of the SOT electrode 101, as is depicted in the cross-sectional illustration of FIG. 1D. In some such embodiments, the contact 122B also extends below an uppermost surface 101E of the SOT electrode 101, adjacent to the SOT electrode sidewall 101D. but above a lowermost surface 101F of the SOT electrode 101, as illustrated in FIG. 1D.

Figure 1D:
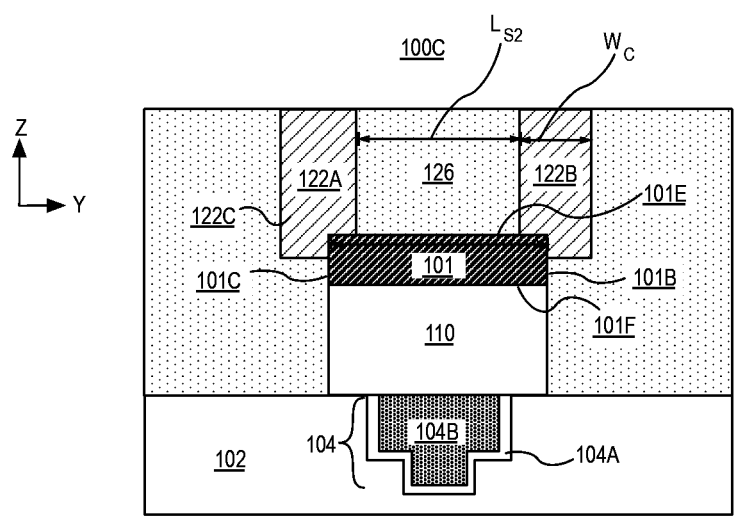
FIG. 1D is an illustration of a cross-sectional view of a SOT memory device, where a first and a second contact electrode extend below an uppermost surface of a SOT electrode of a SOT memory device.

In another embodiment, the contact 122A is adjacent to the SOT electrode sidewall 101C and has no portion on the SOT electrode 101, for example as illustrated in FIG. 1D. The contact 122A may have a lowermost surface that extends between 25%-50% below the uppermost surface SOT electrode surface 101E, as illustrated. Contact 122B may be similarly also be adjacent to the SOT electrode sidewall 101D and have no portion on the uppermost SOT electrode surface 101E. The contact 122B may have a lowermost surface that extends between 25%-50% below the uppermost surface SOT electrode surface 101E, as illustrated. In such implementations, to avoid electrically shorting SOT memory device 100D, lowermost surfaces of the contacts 122A and 122B do not extend to or below a level of the lowermost SOT electrode surface 101F. In the illustrated embodiment, the lateral distance, $L_{S3}$, between contact 122A and contact 122B is substantially the same as the $L_{SOT}$ or the length, $L_{MTJ}$ of the MTJ device 110.

Referring again to FIG. 1A, the SOT electrode 101 may advantageously include a metal with high degree of spin orbit coupling. A metal with a high degree of spin-orbit coupling has an ability to inject a large spin polarized current in to the free magnet 112. A large spin polarized current may exert a large amount of torque and influence the magnetization of the free magnet 112 to switch faster. In an embodiment, the SOT electrode 101 includes a metal such as, but not limited to, tantalum, tungsten, platinum or gadolinium. In an embodiment, SOT electrode 101 includes a beta phase tantalum or beta phase tungsten. A SOT electrode 101 including a beta phase tantalum or beta phase tungsten may have a higher spin hall efficiency than a SOT electrode including platinum. A high spin hall efficiency denotes that the SOT electrode 101 can generate a large spin hall current for a given charge current that is passed through the SOT electrode 101. In an embodiment, the SOT electrode 101 has thickness of between 5 nm and 20 nm.

In an embodiment, the free magnet 112 includes a magnetic material such as Co, Ni, Fe or alloys of these materials. In an embodiment, the free magnet 112 includes a magnetic material such as CoB, FeB, CoFe or CoFeB. In some embodiments, the free magnet 112 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 112 is FeB, where the concentration of boron is between 10 and 40 atomic percent of the total composition of the FeB alloy. In an embodiment, the free magnet 112, for applications in an in-plane MTJ device, has a thickness between 2.0 nm and 3.0 nm. In an embodiment, the free magnet 112, for applications in a MTJ device 110, has a thickness between 0.9 nm and 2.0 nm.

In an embodiment, tunnel barrier 114 is composed of a material suitable for allowing electron current having a majority spin to pass through tunnel barrier 114, while impeding, at least to some extent, electron current having a minority spin from passing through tunnel barrier 114. Thus, tunnel barrier 114 (or spin filter layer) may also be referred to as a tunneling layer for electron current of a particular spin orientation. In an embodiment, tunnel barrier 114 includes a material such as, but not limited to, magnesium oxide (comprising predominantly magnesium and oxygen) or aluminum oxide (comprising predominantly aluminum and oxygen). In an embodiment, tunnel barrier 114 including MgO has a crystal orientation that is (001) and is lattice matched to free magnet 112 below tunnel barrier 114 and fixed magnet 116 above tunnel barrier 114. In an embodiment, tunnel barrier 114 is MgO and has a thickness in the range of 1 nm to 2 nm. In an embodiment, a free magnet 112 including a $Co_{100-x-y}Fe_xB_y$, is highly lattice matched to the tunnel barrier 114 including an MgO. Lattice matching a crystal structure of the free magnet 112 with the tunnel barrier 114 enables a higher tunneling magnetoresistance (TMR) ratio in the MTJ device 110.

In some embodiments, the fixed magnet 116 includes a material and has a thickness sufficient for maintaining a fixed magnetization. In an embodiment, the fixed magnet 116 of the MTJ device 110 includes an alloy such as CoFe or CoFeB. In an embodiment, the fixed magnet 116 comprises a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the fixed magnet 116 is FeB, where the concentration of boron is between 10 and 40 atomic percent of the total composition of the FeB alloy. In an embodiment the fixed magnet 116, for applications in a MTJ device 110, has a thickness that is between 1 nm and 3 nm.

Figure 1E:
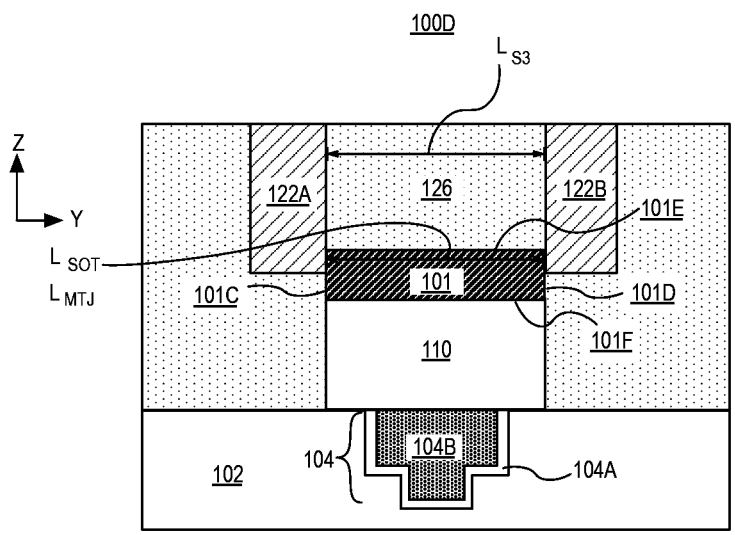
FIG. 1E is an illustration of a cross-sectional view of a SOT memory device, where a first and a second contact electrode are adjacent to opposite sidewalls of a SOT electrode of a SOT memory device.
Figure 1F:
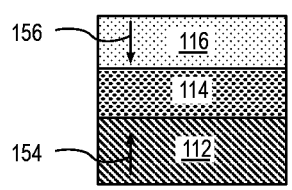
FIG. 1F illustrates a cross-sectional view depicting a direction of magnetization in a free magnet that is anti-parallel to a direction of magnetization in a fixed magnet, in accordance with an embodiment of the present disclosure.

FIG. 1F illustrates a cross-sectional view depicting the free magnet 112 of a MTJ device 110 having a direction of magnetization (denoted by the direction of the arrow 154) that is perpendicular to a horizontal surface 112A of the free magnet 112. In the illustrative embodiment, the magnetization 154 is anti-parallel to a direction of magnetization (denoted by the direction of the arrow 156) in the fixed magnet 116. When the magnetization 154 in the free magnet 112 is directed opposite (anti-parallel) to the magnetization 156 in the fixed magnet 116, the MTJ device 110 device is said to be in a high resistance state.

Figure 1G:
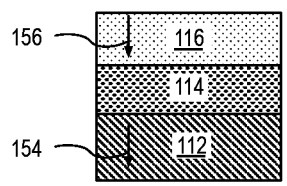
FIG. 1G illustrates a cross-sectional view depicting a direction of magnetization in a free magnet that is parallel to a direction of magnetization in a fixed magnet, in accordance with an embodiment of the present disclosure.

Conversely, FIG. 1G illustrates a cross-sectional view depicting the free magnet 112 of the MTJ device 110 having a magnetization 154 that is parallel to a direction of magnetization 156 in the fixed magnet 116. When the magnetization 154 in the free magnet 112 is directed parallel to the magnetization 156 in the fixed magnet 116, the MTJ device 110 is said to be in a low resistance state.

In some embodiments, when the free magnet 112 and the fixed magnet 116 have approximately similar thicknesses, an injected spin polarized current, which changes the direction of the magnetization 154 in the free magnet 112, can also affect the magnetization 156 of the fixed magnet 116. In some such embodiments, a fixed magnet 116 having a higher magnetic anisotropy than the free magnet 112 can make the fixed magnet 116 more resistant to accidental flipping. Magnetic anisotropy of the fixed magnet 116 may also be increased by coupling the fixed magnet 116 with a synthetic antiferromagnetic (SAF) structure 118. In another embodiment, a synthetic antiferromagnetic (SAF) structure 118 can be disposed between the electrode 120 and the fixed magnet 116 in order to reduce the stray field acting on the free magnet 116.

Figure 1H:
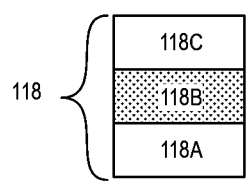
FIG. 1H illustrates a cross-sectional view of individual layers of a synthetic antiferromagnetic structure, in accordance with an embodiment of the present disclosure.

FIG. 1H illustrates cross-sectional view of the SAF structure 118 in an accordance of an embodiment of the present disclosure. In an embodiment, the SAF structure 118 includes a non-magnetic layer 118B sandwiched between a pinning ferromagnet 118A and a pinning ferromagnet 118C as depicted in FIG. 2D. The pinning ferromagnet 118A and the pinning ferromagnet 118C are anti-ferromagnetically coupled to each other. In an embodiment, the pinning ferromagnet 118A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 118B includes a ruthenium or an iridium layer. In an embodiment, the pinning ferromagnet 118C includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, a ruthenium based non-magnetic layer 118B has a thickness between 0.3 nm and 1.0 nm to advantageously enable anti-ferromagnetic coupling between the pinning ferromagnet 118A and the pinning ferromagnet 118C.

It is to be appreciated that additional layers may be present within an MTJ device. For example, a non-magnetic spacer layer may exist between the fixed magnet 116 and the SAF structure 118. A non-magnetic spacer layer, may for example, enable antiferromagnetic coupling between the SAF structure 118 and the fixed magnet 116. In an embodiment, a non-magnetic spacer layer may include a metal such as Ta, Mo, W, Ru or Ir.

Once again referring the FIG. 1A, in an embodiment, the conductive interconnect 104 includes a barrier layer 104A, such as tantalum nitride, and a fill metal 104B, such as copper, tungsten or ruthenium. In an embodiment, the dielectric layer 102 includes a material such as but not limited to silicon dioxide, silicon nitride, silicon carbide, or carbon doped silicon oxide. The dielectric layer 102 may have an uppermost surface that is substantially co-planar with an uppermost surface of the conductive interconnect 104, as illustrated. In some examples, the dielectric layer 102 has a total thickness between 70 nm and 300 nm. In some embodiments, conductive interconnect 104 is electrically connected to a circuit element such as a transistor (not shown). In some embodiments, the dielectric layer 124 includes a material such as but not limited to silicon dioxide, silicon nitride, silicon carbide, silicon oxynitride, or carbon doped silicon oxide.

Figure 2A:
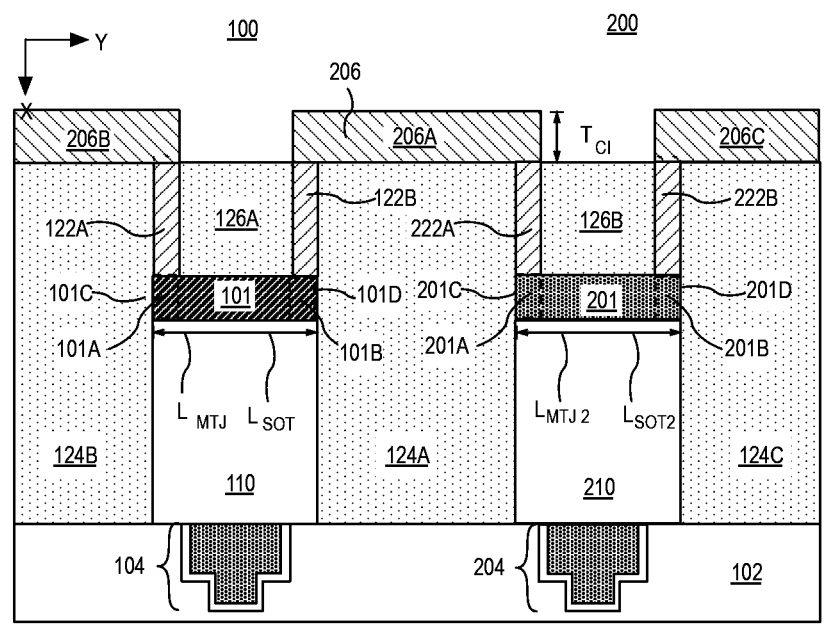
FIG. 2A is a cross sectional illustration of a first SOT memory device in series with a second SOT memory device, in accordance with embodiments of the present disclosure.

FIG. 2A is a cross sectional illustration of a SOT memory device 200 in series with the SOT memory device 100, in accordance with embodiments of the present disclosure. SOT memory device 100 is laterally separated from the SOT memory device 200 by a portion 124A of the dielectric layer 124. The SOT memory device 200 includes one or more features of the SOT memory device 100. In the illustrative embodiment, SOT memory device 200 includes a SOT electrode 201 on a MTJ device 210 that is over an interconnect 204. The SOT memory device 200 includes a first contact 222A over and coupled with a first portion 201A of the SOT electrode 201 and a second contact 222B over and coupled with a second portion 201B of the SOT electrode 201, with portion 201C therebetween.

In some embodiments, a conductive interconnect 206 electrically couples one contact of SOT memory device 100 to a contact of the SOT memory device 200. In the illustrative embodiment, a conductive interconnect portion 206A electrically couples the contact 122B of the SOT memory device 100 with a contact 222A of the SOT memory device 200. Conductive interconnect portion 206A extends laterally from an uppermost surface of the contact 122B, extends over the dielectric layer portion 104A and onto an uppermost surface of contact 222A, as shown. It is to be appreciated that interconnect portion 206A may couple with some portion of the contact 122B and some portion of the contact 222A, although in the illustrated embodiment, interconnect portion 206A is over the entire uppermost surfaces of the contacts 122B and 222A. The conductive interconnect portion 206A may also extend over and overlap with uppermost surfaces of portions 126A of dielectric layer 126 and/or portions 126B of dielectric layer 126.

An interconnect portion 206B extends over an entire uppermost surface of contact 122A and extends over a portion 124B of the dielectric layer 124, as shown. The interconnect portion 206B may extend over some portion of the uppermost surface of contact 122A. The conductive interconnect portion 206B may also extend over and overlap with uppermost surfaces of dielectric layer portion 126A. The interconnect portion 206B may be electrically coupled to a voltage source, ground or to a contact of a third SOT memory device.

An interconnect portion 206C extends over an entire uppermost surface of contact 222B and extends over dielectric layer portion 124C, as shown. The interconnect portion 206C may extend over some portion of the uppermost surface of contact 222B. The conductive interconnect portion 206C may also extend over and overlap with uppermost surfaces of dielectric layer portion 126. The interconnect portion 206C may be electrically coupled to a second voltage source, or to a contact of a fourth SOT memory device.

It is to be appreciated that interconnect portions 206A, 206B and 206C are not in physical contact with each other. For example, while interconnect portions 206A and 206B may extend over dielectric layer portion 126A, the interconnect portions 206A and 206B remain physically separated. Similarly, while interconnect portions 206A and 206C may extend over dielectric layer portion 126B, the interconnect portions 206A and 206C remain physically separated.

Conductive interconnect 206 may include materials that are the same or substantially the same as the same as the material of the contact 122A or contact 122B. In other embodiments, conductive interconnect 206 may include one or more layers. In an embodiment, the conductive interconnect 206 includes a barrier layer, such as tantalum nitride, and a fill metal, such as copper, tungsten or ruthenium. In some embodiments, the thickness, $T_{CI}$, of the conductive interconnect 206, ranges between 10 nm and 30 nm.

The illustrative embodiment in FIG. 2A represents contacts 122A and 122B of FIG. 1A. In other embodiments, contacts 122A and 122B may be as in SOT memory device 100B, 100C, or 100D, shown in FIG. 1C, 1D or 1E, respectively. Similarly, the illustrative embodiment in FIG. 2A represents contacts 222A and 222B that have one or more features of contacts 122A and 122B, respectively. In other embodiments, not illustrated, contacts 222A and 222B have one or more features of contacts 122A and 122B, respectively such as is represented in FIG. 1C, 1D or 1E.

Figure 2B:
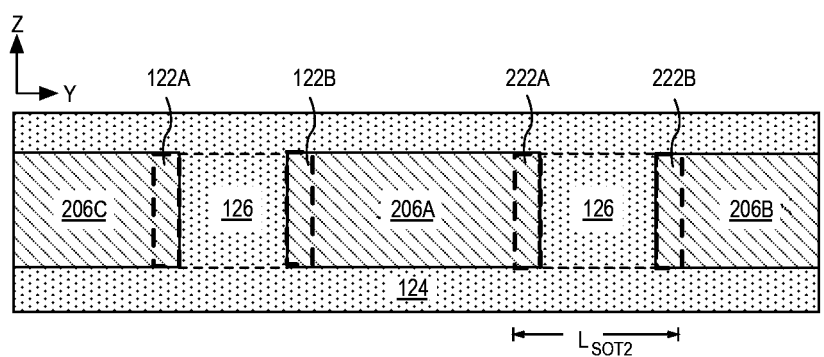
FIG. 2B illustrates a plan view of the SOT memory device of FIG. 2A.

FIG. 2B illustrates a plan view of the structure in FIG. 2A. In the illustrative embodiment, the contacts 122A and 122B (represented by dashed lines) and contacts 222A and 222B (represented by dashed lines), have rectangular footprints. Interconnect portions 206A, 206B and 206C are physically separated from each other as shown.

Figure 3A:
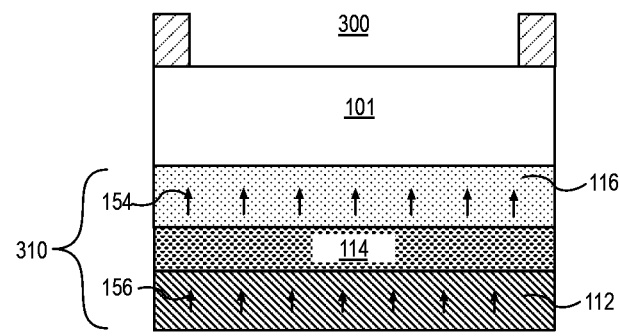
FIG. 3A illustrates a SOT memory device in a low resistance state.
Figure 3B:
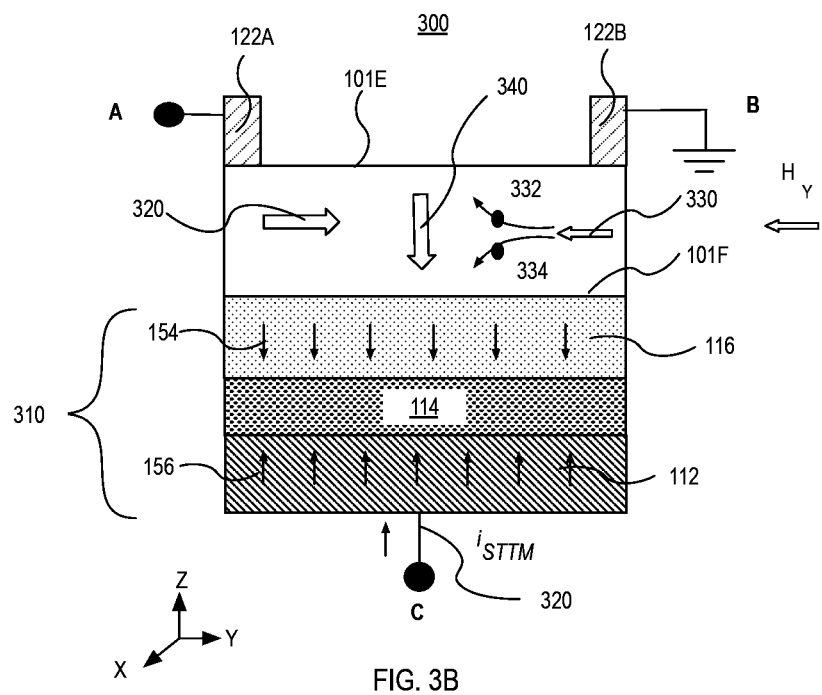
FIG. 3B illustrates a SOT memory device switched to a high resistance state after the application of a spin hall current and an STTM current.
Figure 3C:
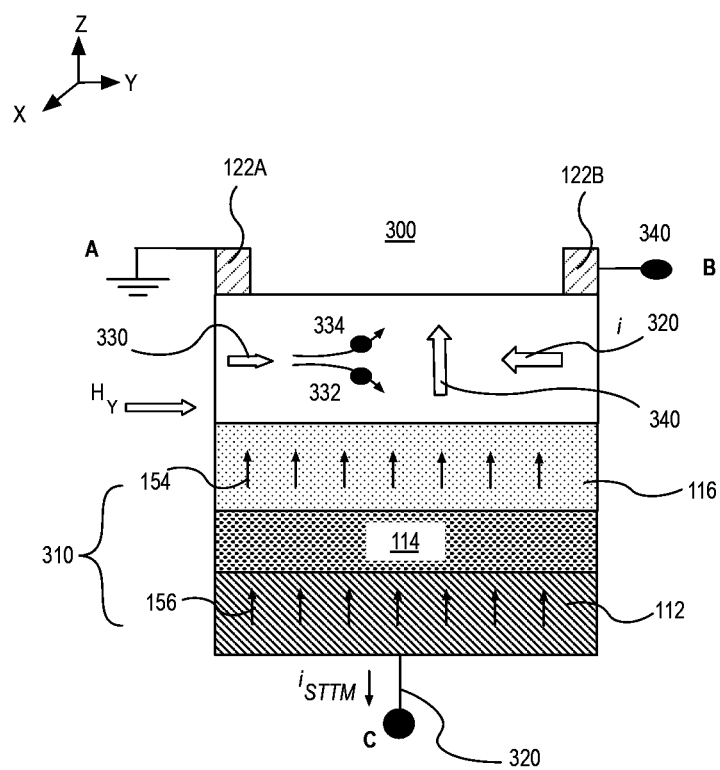
FIG. 3C illustrates a SOT memory device switched to a low resistance state after the application of a spin hall current and an STTM current.

FIGS. 3A-3C illustrate a mechanism for switching a spin orbit torque (SOT) memory device such as a spin orbit torque (SOT) memory device 300 including an MTJ device 310 on the SOT electrode 101. In the illustrative embodiment, the MTJ device 310 is a pMTJ device where the pMTJ device includes at least some of the features of the MTJ device 110, such as the free magnet 112, the fixed magnet 116 and the tunnel barrier 114 between the free magnet 112, the fixed magnet 116, where the free magnet 112 and the fixed magnet 116 have perpendicular anisotropy. SOT memory device 100 further includes laterally separated contacts 122A and 122B on the SOT electrode 101.

FIG. 3A illustrates a pSOT memory device 300 including the pMTJ device 310 on the SOT electrode 101, where a magnetization 154 of the free magnet 112 is aligned in a direction parallel to the magnetization 156 of the fixed magnet 116. In an embodiment, the direction of magnetization 154 of the free magnet 112 and the direction of magnetization 156 of the fixed magnet 116 are both in the negative Z-direction, as illustrated in FIG. 3A. As discussed above, when the magnetization 154 of the free magnet 112 is in a direction parallel to a direction of magnetization 156 of the fixed magnet 116, MTJ device 110 is in a low resistance state FIG. 3B illustrates the pMTJ device 310 of the spin orbit torque (SOT) memory device 300 switched to a high resistance state. In an embodiment, a reversal in the direction of magnetization 154 of the free magnet 112 in FIG. 3B relative to the direction of magnetization 154 of the free magnet 112 in FIG. 3A is brought about by (a) driving a sufficient spin transfer torque (STTM) current ($i_{STTM}$) 330 in the pMTJ 320, and by (b) inducing a spin diffusion current 340 in the spin orbit torque electrode 101, in the negative Z-direction. In an embodiment, magnetization reversal can also be aided by applying an external magnetic field, $H_Y$, in the negative Y-direction. In other embodiments, an in-plane exchange bias at an interface between a ferromagnetic—free magnet 112 and an antiferromagnetic SOT electrode 101 can aid with magnetization reversal instead of an externally applied magnetic field $H_Y$.

In an embodiment, the current 320 passes through SOT electrode in the Y-direction (by applying a positive voltage at terminal A with respect to a grounded terminal B). In response to the current 320, an electron current 330 flows in a negative Y-direction. The electron current 330, which include electrons with two opposite spin orientations experience spin dependent scattering in the spin orbit torque electrode 101. Spin dependent scattering causes Type I electrons with a spin angular moment 332 (in the positive x direction) to be deflected upwards towards spin orbit torque electrode surface 101E and Type II electrons with a spin angular moment 334 (directed in the negative X direction) to be deflected downwards towards spin orbit torque electrode surface 101F (towards free magnet 116). The separation between the electrons with the spin angular moment 332 and the electrons with the spin angular moment 334 induces a spin diffusion current 340 in the spin orbit torque electrode 101. The spin diffusion current 340 is directed in negative Z direction toward the free magnet 112 of the pMTJ device 310. The spin diffusion current 340 induces a spin hall torque on the magnetization 154 of the free magnet 112 causing the magnetization to change from the positive Z-direction depicted in FIG. 3A, to an intermediate magnetization state (in the positive X direction). In an embodiment, the current 320, flowing through the MTJ device 110 exerts a torque on the magnetization 154 of the free magnet 112 to assist flipping the magnetization 154. In some such embodiment, the presence of an external magnetic field provides a symmetry breaking field like torque to assist flipping the magnetization 154. The combination of Spin Hall torque, spin transfer torque and torque from the external magnetic field, $H_Y$, causes flipping of magnetization 154 in the free magnet 112 from the intermediate magnetization state (negative x-direction) to a positive z-direction illustrated in FIG. 3B. In other embodiments, an in-plane exchange bias at an interface between a ferromagnetic—free magnet 112 and an antiferromagnetic SOT electrode 101 can aid with magnetization reversal instead of an externally applied magnetic field $H_Y$.

FIG. 3C illustrates the pMTJ device 310 of the spin orbit torque (SOT) memory device 300 switched to a low resistance state. In an embodiment, a reversal in the direction of magnetization 154 of the free magnet 112 in FIG. 3C compared to the direction of magnetization 154 of the free magnet 112 in FIG. 3B is brought about by (a) reversing the direction of the spin diffusion current 340 in the SOT electrode 101, inducing a spin diffusion current 340 in the spin orbit torque electrode 101, away from the free magnet 112 of the pMTJ and in the Z-direction and by (b) reversing the direction of spin transfer torque (STTM) current ($i_{STTM}$) 320 in the pMTJ device 310. In one embodiment, the direction of current 320, i, is reversed by applying a positive voltage at terminal B (connected to contact 122A for example) with respect to a grounded terminal A (connected to terminal B) for example.

In an embodiment, magnetization reversal can also be aided by applying an external magnetic field, $H_Y$, in the negative Y direction (as shown). In some examples, an in-plane exchange bias at an interface between the free magnet 112 and the SOT electrode 101 can provide a similar effect as the externally applied magnetic field $H_Y$ and replace the external applied magnetic field $H_Y$.

Figure 4:
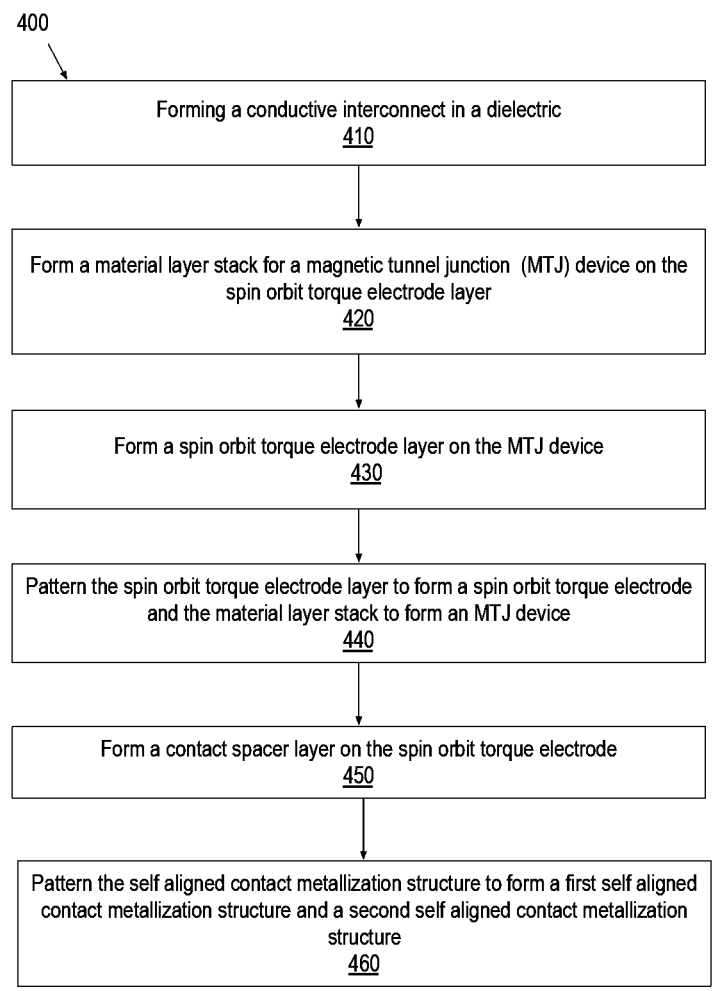
FIG. 4 illustrates an outline of a method to fabricate a self-aligned SOT memory device.

FIG. 4 illustrates a flow diagram of a method to fabricate a SOT memory device. The method 400 begins at operation 410 by forming a conductive interconnect in a dielectric layer above a substrate. In some embodiments, the conductive interconnect is formed in a dielectric layer by a damascene or a dual damascene process. The method 400 continues at operation 420 with the formation of a material layer stack for the formation of an MTJ device on the conductive interconnect. In exemplary embodiments, all layers in the material layer stack are blanket deposited in-situ without breaking vacuum. In a simplest embodiment, forming the material layer stack includes a deposition of a deposition of a synthetic antiferromagnetic (SAF) structure over the conductive interconnect, deposition of a fixed magnetic layer over the SAF structure, deposition of a tunnel barrier layer deposited over the fixed magnetic layer, deposition of a free magnetic layer on the tunnel barrier layer.

The method 400 continues in operation 430 with the deposition of a SOT electrode layer on the material layer stack for the formation of an MTJ device. The SOT electrode layer may blanket deposited on the material layer stack.

The method 400 is continued at operation 440 with patterning of the SOT electrode layer to form a SOT electrode followed by patterning of the material layer stack to form a MTJ device. The method 400 is then resumed at operation 450 with the formation of a contact spacer on the SOT electrode 101.

The method 400 is then continued at operation 460 with the patterning of the contact spacer layer to form a first contact over a first portion of the SOT electrode and a second contact over a second portion of the SOT electrode.

FIG. 5A-FIG. 8B illustrate cross-sectional views representing various operations in a method of fabricating a SOT memory device, such as the SOT memory device 100 in accordance with embodiments of the present disclosure.

FIG. 5A illustrates a conductive interconnect 104 surrounded by a dielectric layer 102 formed above a substrate. In some embodiments, the conductive interconnect 104 is formed in a dielectric layer 102 by a damascene or a dual damascene process, such as any known in the art. In an embodiment, the conductive interconnect 104 includes a barrier layer 104A, such as tantalum nitride, and a fill metal 104B, such as copper, tungsten or ruthenium. In an embodiment, the conductive interconnect 104 is fabricated using a subtractive etch process when materials other than copper are utilized. In an embodiment, the dielectric layer 102 includes a material such as but not limited to silicon dioxide, silicon nitride, silicon carbide, or carbon doped silicon oxide. The dielectric layer 102 may have an uppermost surface that is substantially co-planar with an uppermost surface of the conductive interconnect 104, as illustrated. In some examples, the dielectric layer 102 has a total thickness between 70 nm and 300 nm. In some embodiments, conductive interconnect 104 is electrically connected to a circuit element such as a transistor (not shown) FIG. 5B illustrates a cross-sectional view of FIG. 5A following the formation of a MTJ material layer stack 550, formation of a SOT layer 509 on the material layer stack 550 on the SOT layer 509. In an embodiment, the various layers are deposited without an air break to avoid oxidation between metallic interfaces.

In some embodiments, forming the material layer stack 550 includes deposition of layers utilized to form a SAF structure 501. In some embodiments, the layers utilized to form SAF layer 501 are blanket deposited on the conductive interconnect 104 and on the dielectric layer 102 using a PVD process. The layers utilized to form SAF layer 501 are the same or substantially the same as the layers in the SAF structure 118 described above.

In an embodiment, the fixed magnetic layer 503 is blanket deposited on an uppermost surface of the SAF layer 501. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 503 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 503 includes a material that is the same or substantially the same as the material of the fixed magnet 116 described above. In some examples, the fixed magnetic layer 503 may be deposited to a thickness between 1.0 nm and 3.0 nm.

The process continues with deposition of a tunnel barrier layer 505. In some embodiments, the tunnel barrier layer 505 is blanket deposited on the fixed magnetic layer 503. In an embodiment, the tunnel barrier layer 505 includes a material such as MgO or $Al_2O_3$. In an exemplary embodiment, the tunnel barrier layer 505 is an MgO and is deposited using a reactive sputter process. In an embodiment, the reactive sputter process is carried out at room temperature. In an embodiment, the tunnel barrier layer 505 is deposited to a thickness between 0.8 nm and 1.5 nm. In an embodiment, the deposition process is carried out in a manner that yields a tunnel barrier layer 505 having an amorphous structure. In some examples, the amorphous tunnel barrier layer 505 becomes crystalline after a high temperature anneal process to be described further below. In other embodiments, the tunnel barrier layer 505 is crystalline as deposited.

The process is continued with blanket depositing a free magnetic layer 507 on the SOT layer 501. The free magnetic layer 507 layer may be deposited using a PVD process. In an embodiment, the free magnetic layer 507 includes a material that is the same or substantially the same as the material of the free magnet 112. In an exemplary embodiment, the free magnetic layer 507 is $C_{100-x-y}Fe_xB_y$, where X and Y each represent atomic percent, further where X is between 50 and 80 and Y is between 10 and 40, and further where the sum of X and Y is less than 100. In some embodiments, the deposition process includes the formation of a free magnetic layer 507 that is amorphous. The free magnetic layer 507 may deposited to a thickness between 0.9 nm and 2.0 nm to fabricate a perpendicular MTJ device.

The deposition process concludes with deposition of a spin orbit torque layer 509. In exemplary embodiments, the is spin orbit torque layer 509 blanket deposited on the free magnetic layer 507. In an embodiment, the spin orbit torque layer 501 is a material that is substantially similar to the material of the spin orbit torque electrode 101. In an embodiment, the spin orbit torque layer 501 includes a metal such as, not limited to, iridium, platinum, tungsten, beta-tungsten and beta-tantalum. In an embodiment, the spin orbit torque layer 501 is deposited using a physical vapor deposition (PVD) process or a plasma enhanced chemical vapor deposition (PECVD) process. In an embodiment, the spin or bit torque SOT layer 501 has a thickness that is between 5 nm and 20 nm. The SAF layer 501, the fixed magnetic layer 503, tunnel barrier layer 505, the free magnetic layer 507 and the SOT layer 509 may be deposited using processes at temperatures of up to 350 degrees.

In an embodiment, after all the layers in the material layer stack 550 are deposited, an anneal is performed under conditions well known in the art. In an embodiment, the anneal process enables formation of a crystalline MgO-tunnel barrier layer 505 to be formed. In an embodiment, the anneal is performed immediately post deposition but before patterning of the MTJ material layer stack 550. A post-deposition anneals of the MTJ material layer stack 550 is carried out in a furnace in a forming gas environment. In an embodiment, the forming gas includes a mixture of $H_2$ and $N_2$ gas. In an embodiment, the anneal temperature ranges between 300 and 425 degrees Celsius.

In an embodiment, the annealing process also promotes solid phase epitaxy of the free magnetic layer 507 to follow a crystalline template of the tunnel barrier layer 505 (e.g., MgO) that is directly above the fixed magnetic layer 503. In an embodiment, the anneal also promotes solid phase epitaxy of the fixed magnetic layer 503 to follow a crystalline template of the tunnel barrier layer 505 (e.g., MgO) that is directly below the free magnetic layer 507. <001> Lattice matching between the tunnel barrier layer 505 and the free magnetic layer 507 and <001> lattice matching between the tunnel barrier layer 505 and the fixed magnetic layer 503 may enable a TMR ratio of at least 90% to be obtained in the MTJ material layer stack 550.

In an embodiment, the annealing process is also performed in the presence of a magnetic field which sets a direction of magnetization of the fixed magnetic layer 503 and in the free magnetic layer 507. In an embodiment, during the annealing process, an applied magnetic field that is directed perpendicular to a plane of the MTJ material layer stack 550 enables a perpendicular anisotropy to be set in the fixed magnetic layer 503 and in the free magnetic layer 507.

Figure 5C:
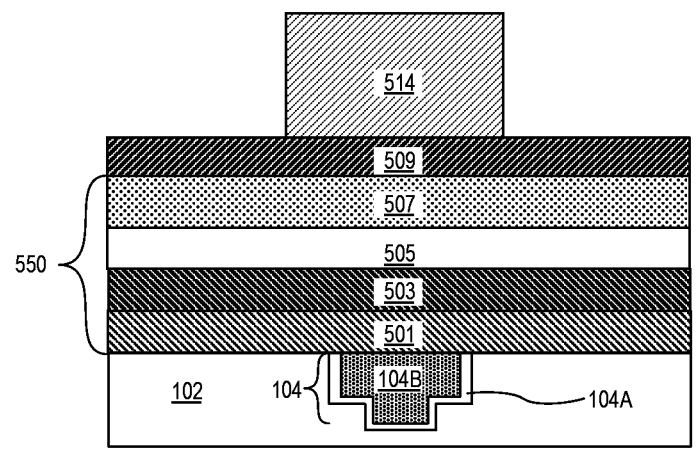
FIG. 5C illustrates a cross-sectional view of the structure in FIG. 5B following the formation of a mask over the SOT layer.

FIG. 5C illustrates a cross-sectional view of the structure in FIG. 5B following the formation of a mask 514 over the SOT layer 509. In some embodiments, the mask 514 includes a dielectric material that has been patterned using a lithographic process followed by a plasma etch process. In other embodiments. In the illustrative embodiment, the mask is formed on a plane above, but laterally aligned with an axis of the conductive interconnect 104. In an embodiment, the mask 514 includes a material such as TiN, Ta or TaN. In an embodiment, the thickness of the top electrode layer ranges from 5 nm-70 nm. The thickness of the mask 514 is chosen to accommodate patterning of the SOT layer 509 and the MTJ material layer stack 550.

The mask 514 defines a shape and size of a MTJ device and a location where the MTJ device is to be subsequently formed with respect the spin orbit torque electrode 101. In some embodiments, the mask 514 has a rectangular shape, as is depicted in the plan view illustration of FIG. 1B. In other embodiments the mask 514 has an elliptical or a circular shape.

Figure 5D:
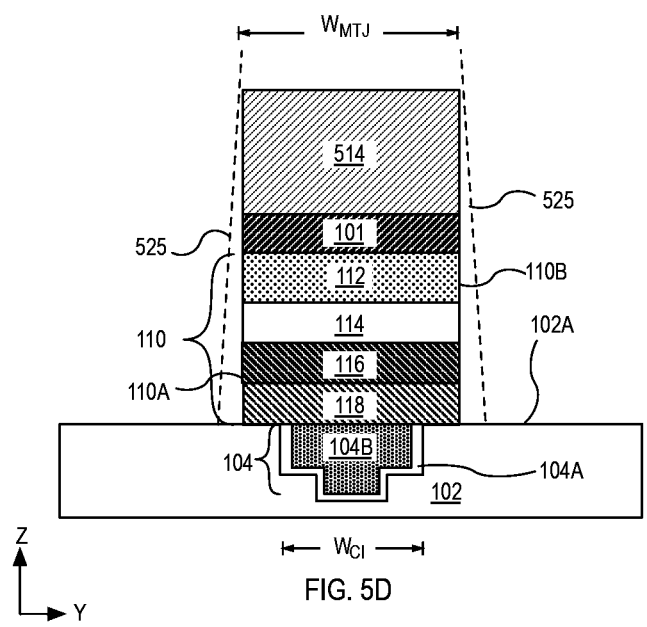
FIG. 5D illustrates a cross-sectional view of the structure in FIG. 5C following the etching of material layer stack to form a SOT electrode and an MTJ device.

FIG. 5D illustrates a cross-sectional view of the structure in FIG. 5C following patterning and etching of the SOT layer 509, and the MTJ material layer stack 550. The patterning process begins with etching the SOT electrode layer 509 to form an SOT electrode 101, and the layers of the MTJ material layer stack 550 to form a MTJ device 110. In an embodiment, the patterning process includes a plasma etch. In the illustrative embodiment, the MTJ device 110 includes a SAF structure 118, a fixed magnet 116 on the SAF structure 118, a tunnel barrier 114 on the fixed magnet 116 and a free magnet 112 on the tunnel barrier 114. In an embodiment, plasma etch process possesses sufficient ion energy and chemical reactivity to render sidewalls 110A and 110B of the MTJ device 110 that are substantially vertical. In other embodiments, depending on properties of the plasma etchants (energy, reactivity, plasma density etc.), the sidewalls 110A and 110B are sloped during the etching process, as indicated by the dashed lines 525.

The plasma etch is halted after exposing an uppermost surface 10A of the dielectric layer 102. In some embodiments, such as is illustrated, the conductive interconnect 104 has a width, $W_{CI}$, that is less than a width, $W_{MTJ}$, of the MTJ device 110. When the conductive interconnect 104 has a width, $W_{CI}$, that is less than a width, $W_{MTJ}$, and covered by the MTJ device 110, the conductive interconnect 104 is not exposed to reactive etchants during etching of the material layer stack 550.

In the illustrative embodiment, the MTJ device 110 has sidewalls 110A and 110B that are substantially vertical. In other embodiments, depending on properties of the plasma etchants (energy, reactivity, density etc.), the MTJ device 110 may have sidewalls that are tapered during the etching process, as indicated by the dashed lines 525.

Figure 5E:
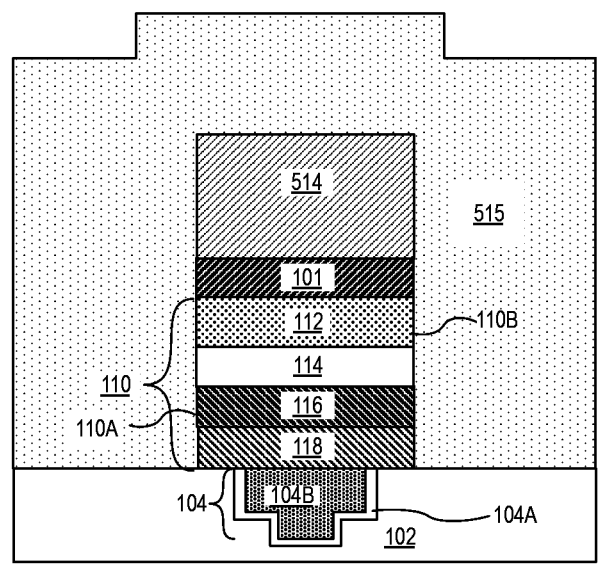
FIG. 5E illustrates a cross-sectional view of the structure in FIG. 5D following the formation of a dielectric layer on and on sidewall of the mask, sidewall of the SOT electrode and on sidewall of the MTJ device.

FIG. 5E illustrates a cross-sectional view of the structure in FIG. 5D following the deposition of a dielectric layer 515 on an uppermost surface of the mask 514, on sidewalls of the SOT electrode 101, and on sidewalls 110A and 110B of the MTJ device 110. In some embodiments, the dielectric layer 515 includes a material such as the material of the dielectric layer 512.

Figure 5F:
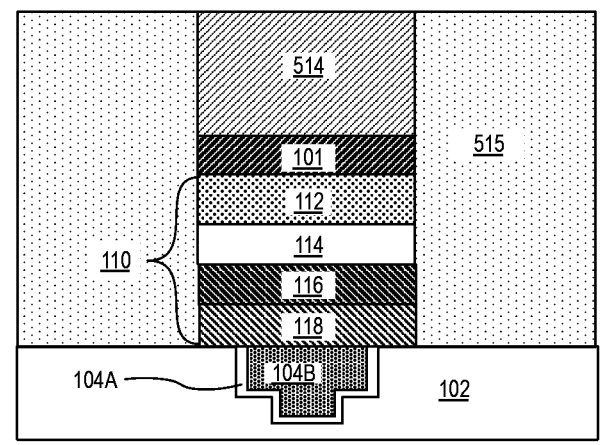
FIG. 5F illustrates a cross-sectional view of the structure in FIG. 5E following the planarization of the dielectric layer and portions of the mask.

FIG. 5F illustrates a cross-sectional view of the structure in FIG. 5E following a planarization of the dielectric layer 515 and upper portions of the mask 514. In some embodiments, the planarization process includes a chemical mechanical polish (CMP) process. In some examples, after a CMP process uppermost surfaces of the dielectric layer 515 and mask 514 are substantially co-planar.

Figure 5G:
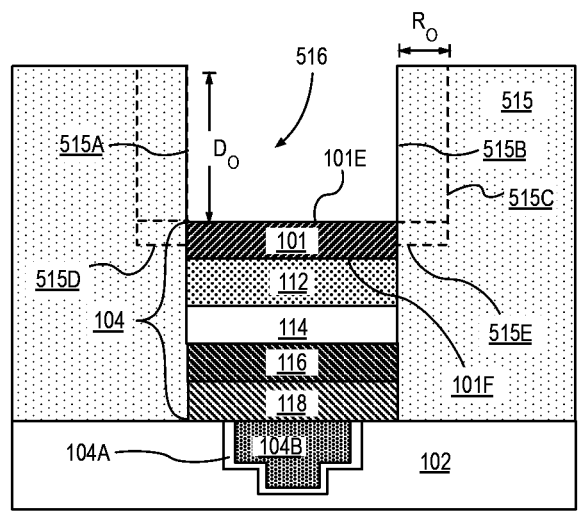
FIG. 5G illustrates a cross-sectional view of the structure in FIG. 5F following the removal of the mask and exposing an uppermost surface of the SOT electrode and sidewalls of the dielectric layer.

FIG. 5G illustrates a cross-sectional view of the structure in FIG. 5F following the removal of the mask 515. In some embodiments, the mask 514 is removed by a wet chemical process, where the wet chemical process removes the mask selectively to the surrounding dielectric layer 515 and to the underlying SOT electrode 101. Removal of the mask creates an opening 516 and exposes portions of sidewalls 515A and 515B of the dielectric layer 515. The depth of the opening, $D_O$, is determined by a thickness of the mask 514 and the amount of mask 514 that was removed during the polish process. In exemplary embodiments, $D_O$, is between 20 nm-50 nm. The depth of the opening 516 will determine a height of contact that will be formed in the opening.

In some embodiments, the mask 514 is removed by a combination of wet and dry processing techniques. In some such embodiments, the sidewalls 515A and 515B may be laterally recessed, by an amount Ro. Recess Ro in the sidewalls 515A and 515B resulting in a sidewall 515C may be advantageous to provide added space for forming contacts.

In some embodiments, the process of laterally recessing sidewalls 515A and 515B may also vertically recess portions of dielectric layer 515 that are adjacent to SOT electrode 101. In some such embodiments, the vertically recessed portions of dielectric layer 515 have surfaces 515D and 515E that are recessed below the uppermost SOT electrode surface 101E, for example by an amount either more than, or less than, $R_O$, but above the lowermost SOT electrode surface 101F.

Figure 5H:
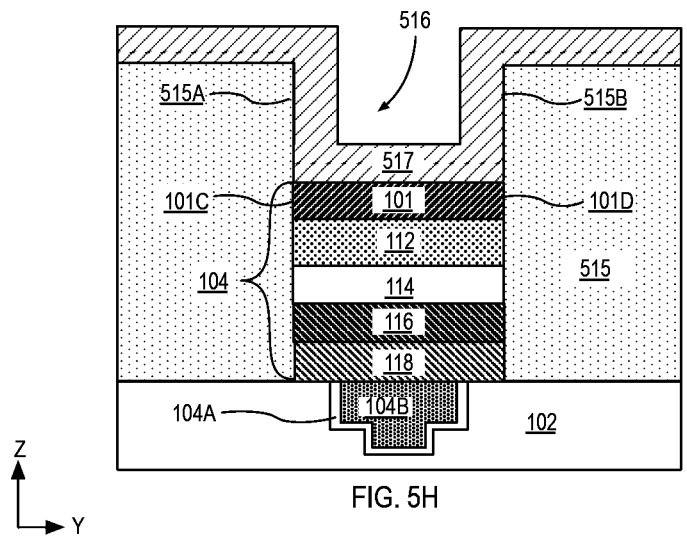
FIG. 5H illustrates a cross-sectional view of the structure in FIG. 5G following the formation of a contact layer on the uppermost surface of the SOT electrode and on sidewalls of the dielectric layer.

FIG. 5H illustrates a cross-sectional view of the structure in FIG. 5G following the formation of a contact layer 517. The contact layer 517 will subsequently form contacts for the SOT electrode 101. In an embodiment, the contact layer 517 includes a metal such as but not limited to ruthenium, tantalum, platinum, palladium, or alloys such as tantalum nitride, titanium nitride. The contact layer 517 may be deposited by an atomic layer deposition (ALD) process, physical vapor deposition (PVD) process or a chemical vapor deposition (CVD) process. A maximum thickness of the contact layer 517 is determined by the geometry of the opening and the deposition process utilized.

In exemplary embodiments, an ALD process is utilized to deposit the contact layer 517 into and filling the opening 516. In an embodiment, the contact layer 517 includes a layer of ruthenium, tantalum nitride, titanium nitride or tantalum that is deposited using an ALD process. In some such embodiments, the ALD process advantageously deposits a conformal contact layer 517 on an uppermost surface of the SOT electrode 101, on sidewalls 515A and 515B and on an uppermost surface of the dielectric layer 515 as shown in FIG. 5H. In the illustrative embodiment, the deposition process also aligns the contact layer 517 with sidewalls 101C and 101D of the SOT electrode 101. In examples where the sidewalls 515A and 515B of the dielectric layer 515 are laterally recessed, the contact layer 517 extends laterally beyond sidewalls 101C and 101D.

Figure 5I:
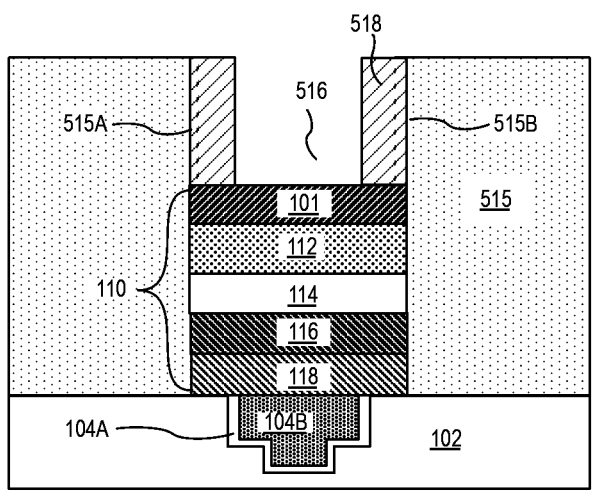
FIG. 5I illustrates a cross-sectional view of the structure in FIG. 5H following an etch process to pattern a contact spacer on the uppermost surface of the SOT electrode and on sidewalls of the dielectric layer.

FIG. 5I illustrates a cross-sectional view of the structure in FIG. 5H following an etch process to pattern contact spacer 518 adjacent to sidewalls 515A and 515B and expose portions of the SOT electrode 101. In an embodiment, the patterning process includes a plasma etch. In examples where the contact layer 517 includes a layer of ruthenium, tantalum nitride, titanium nitride or a plasma etch process may selectively form contact spacer 518 with respect to the SOT electrode 101. In an embodiment, the plasma etch includes a first etch portion that vertically etches a portion of the contact layer 517, and a second etch portion that completes the etch selectively to the underlying SOT electrode 101. In some embodiments the second etch portion may form contact spacer 518 having a tapered lowermost portion.

Figure 5J:
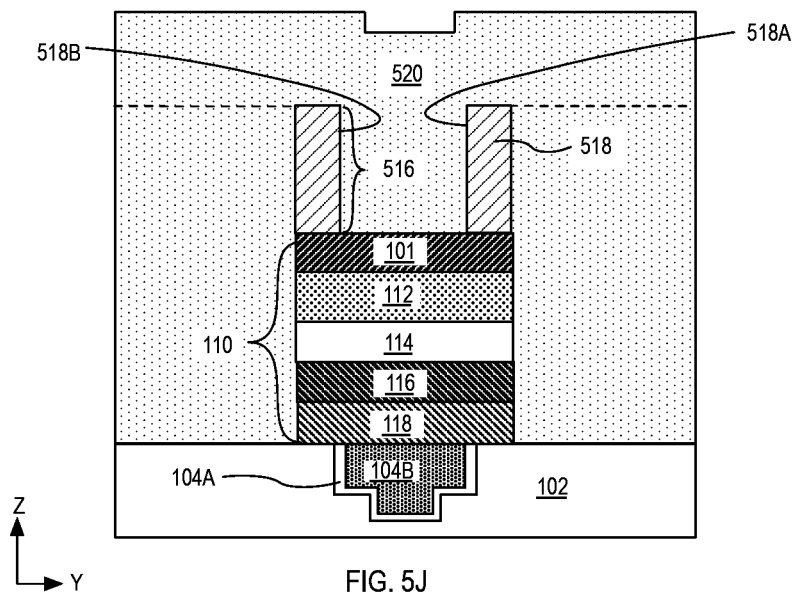
FIG. 5J illustrates a cross-sectional view of the structure in FIG. 5I following the deposition of a second dielectric layer adjacent to the contact spacer and on the first dielectric layer.

FIG. 5J illustrates a cross-sectional view of the structure in FIG. 5I following the deposition of a dielectric layer 520 into the opening 516, on the SOT electrode 101, on sidewalls 518A and 518B and upper portions of the contact spacer 518, and on the dielectric layer 515. In some embodiments, the dielectric layer 520 is blanket deposited by a PECVD process and includes a material that is substantially similar to the material of the dielectric layer 515. In other embodiments, the dielectric layer 520 is blanket deposited by an ALD process and includes a dielectric material such as silicon oxide, silicon nitride or aluminum nitride.

Figure 6A:
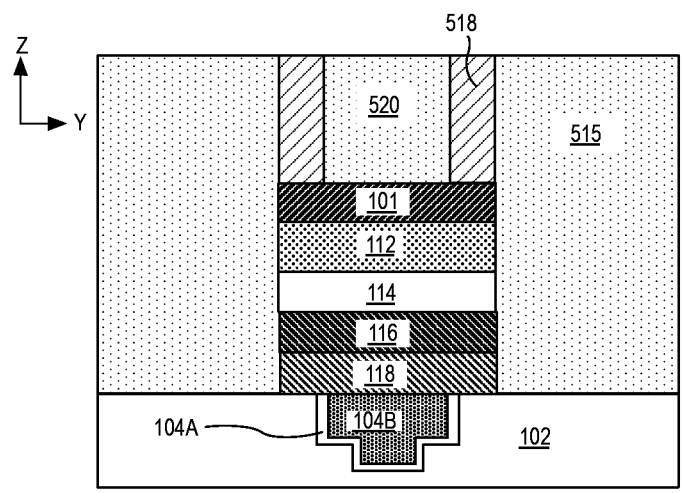
FIG. 6A illustrates a cross-sectional view of the structure in FIG. 5J following a planarization of the dielectric layer and upper portions of the contact spacer.

FIG. 6A illustrates a cross-sectional view of the structure in FIG. 5J following a planarization of the dielectric layer 520 and upper portions of the contact spacer 518. In some embodiments, the planarization process includes a chemical mechanical polish (CMP) process. In some examples, after a CMP process uppermost surfaces of the contact spacer 518 and the dielectric layer 520 are substantially co-planar.

Figure 6B:
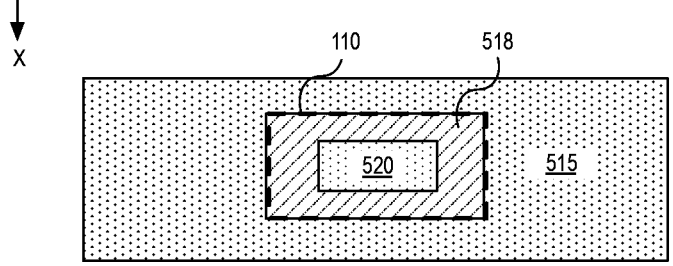
FIG. 6B illustrates a plan-view of the structure in FIG. 6A.

FIG. 6B illustrates a plan-view of the structure in FIG. 6A. An outline of the MTJ device 110 is denoted by the dashed lines in FIG. 6B. In the illustrative embodiment, plan-view illustration, depicts a contact spacer 518 having a continuous loop structure on the uppermost surface of the SOT electrode 101.

Figure 6C:
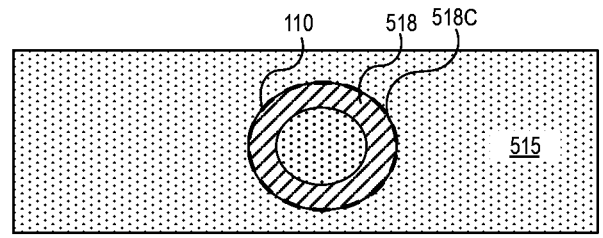
FIG. 6C illustrates a plan-view of the structure in FIG. 6A, where the SOT electrode has a circular footprint and the contact spacer has an annular structure.

In embodiments, where the SOT electrode 101 has a circular footprint, the contact spacer 518 has an annular structure, such as is shown in the plan-view illustration of FIG. 6C. In the illustrative embodiment, an outer wall 518C of the annular structure has a substantially same foot print as the circular footprint of the SOT electrode 101. In other embodiments, the annular structure may have one or more features of the contact 122A or 122B described in association with FIGS. 1C-1E.

Figure 7A:
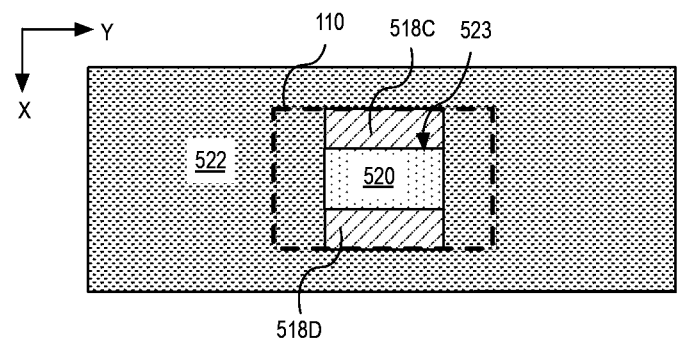
FIG. 7A illustrates a plan-view of the structure in FIG. 6B following the formation of a mask to expose portions of the contact spacer to be removed in a subsequent downstream operation.

FIG. 7A illustrates a plan-view of the structure in FIG. 6B following the formation of a mask 522 to expose portions of the contact spacer 518 to be removed in a subsequent downstream operation. In some embodiments, the mask 514 includes a dielectric material that has been patterned using a lithographic process followed by a plasma etch process. In the illustrative embodiment, the mask 522 defines an opening 523 having an axis that is aligned with an axis of the SOT electrode 101 (dashed lines). While the contact spacer 518 is self-aligned with the SOT electrode 101, for device functionality portions of contact spacer 518 are masked to subsequently form a pair of contacts. In the illustrative embodiment, portions 518C and 518D of the contact spacer 518 are exposed by the mask 522 and will be removed in a downstream process operation.

Figure 7B:
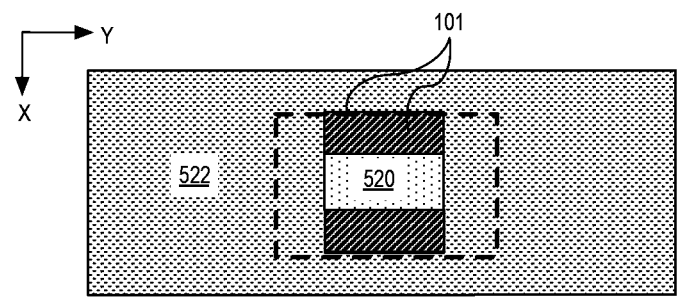
FIG. 7B illustrates a plan-view of the structure in FIG. 7A following removal of the contact spacer portions exposed by the mask.

FIG. 7B illustrates a plan-view of the structure in FIG. 7A following removal of the contact spacer portions 518C and 518D exposed by the mask 522. In an embodiment, a plasma etch process is utilized to remove the contact spacer portions 518C and 518D selectively to the mask 522, dielectric layers 520 and 515 and the underlying SOT electrode 101. In an exemplary embodiment, the plasma etch process completely removes the contact spacer portions 518C and 518D and exposes the underlying SOT electrode 101.

Figure 7C:
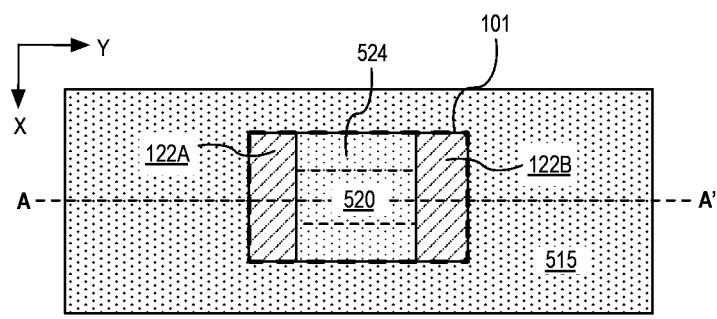
FIG. 7C illustrates a plan-view of the structure in FIG. 7B following the process of forming a first contact and a second contact that is laterally separated from the first contact, above the SOT electrode.

FIG. 7C illustrates a plan-view of the structure in FIG. 7B following the process of depositing a dielectric layer 524 onto the exposed surfaces of the SOT electrode 101, on the mask 522, and on the dielectric layer 520, followed by planarization of the dielectric layer 524 to form a first contact 122A and a second contact 122B on the SOT electrode 101. As shown, the contact 122A is laterally separated and electrically isolated from the contact 122B.

In some embodiments the dielectric layer 524 includes a material that is substantially the same as the material of the dielectric layer 520. The dielectric layer 524 may be deposited by an ALD or a PECVD process. In some embodiments the dielectric layer 524 and mask 522 is removed during a planarization process that first involves removing the dielectric layer 524 from above the dielectric layer 520, and from above the mask 522. The planarization process is then resumed to completely remove the mask 522 and leave portions of the dielectric layer 524 above the SOT electrode 101.

The operations outlined above illustrate a series of operations that can be utilized to form a SOT device 100 including a pair of laterally separated contacts 122A and 122B that are self-aligned to the SOT electrode 101.

FIGS. 8A-8D illustrate a sequence of process operations that form conductive interconnects that will permit electrical connectivity between one SOT device and a second adjacent SOT device. For simplicity only one SOT device is illustrated. An illustration of two SOT devices physically coupled by a bridging contact is shown in FIG. 2A.

Figure 8A:
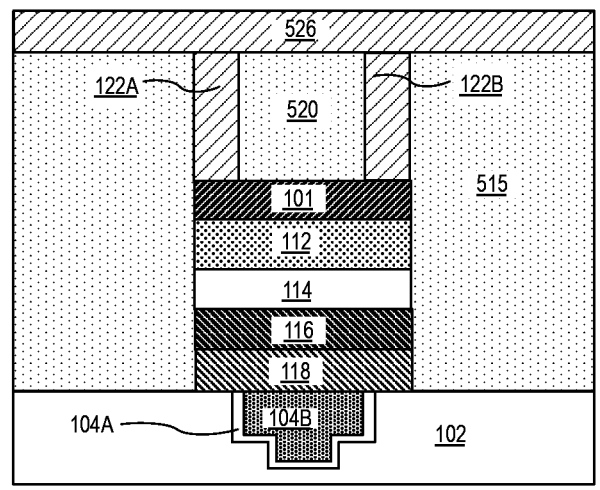
FIG. 8A illustrates a cross section view through the plan view structure of FIG. 7C, following a blanket formation of a conductive interconnect layer.

FIG. 8A illustrates a cross-sectional view of the structure of FIG. 7B though a line A-A', following the formation of a conductive interconnect layer 526 on the contacts 122A and 122B, on the dielectric layer 520 and on the dielectric layer 515. In an embodiment, the conductive interconnect layer 526 includes a material that is the same or substantially the same as the material of the contact layer 517. In an embodiment, the conductive interconnect layer 526 is deposited to a thickness between 10 nm and 20 nm. In other embodiments, conductive interconnect 526 may include one or more layers. In an embodiment, the conductive interconnect 526 includes a barrier layer, such as tantalum nitride, and a fill metal, such as copper, tungsten or ruthenium.

Figure 8B:
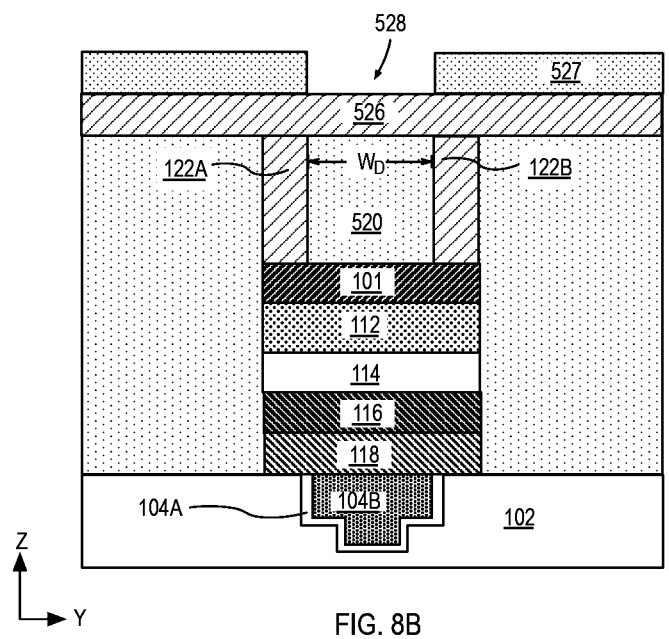
FIG. 8B illustrates a cross section of the structure in FIG. 8A, following the formation of a mask on and exposing portions of the conductive interconnect layer above the SOT electrode.

FIG. 8B illustrates a cross-sectional view of the structure in FIG. 8A following the formation of a mask 527 over the conductive interconnect layer 526. In some embodiments, the mask 514 includes a dielectric material that has been patterned using a lithographic process followed by a plasma etch process. In the illustrative embodiment, the mask 527 includes an opening 528 having a width that is substantially equal to a width, $W_D$, of the dielectric layer 520. In other embodiments the opening 528 can have a width that is smaller than $W_D$.

Figure 8C:
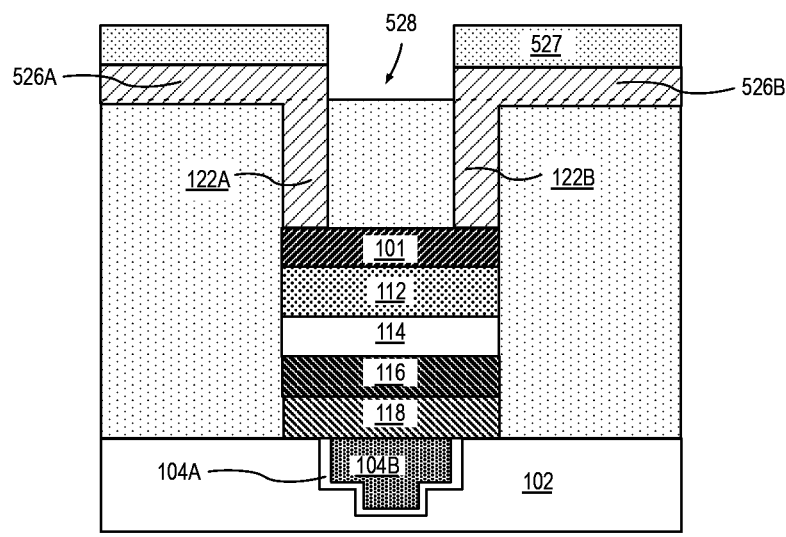
FIG. 8C illustrates a cross section of the structure in FIG. 8B, following the patterning of the conductive interconnect layer exposed by the mask.

FIG. 8C illustrates a cross-sectional view of the structure in FIG. 8B following the patterning of the conductive interconnect layer 526 exposed by the opening 528 in the mask 527. In an embodiment, the patterning process includes a plasma etch process, where the plasma etch process etches the conductive interconnect layer 526 selectively to the dielectric layer 520 and the mask 527, forming interconnect features 526A and 526B, which may be coupled to different circuit nodes, for example.

Figure 8D:
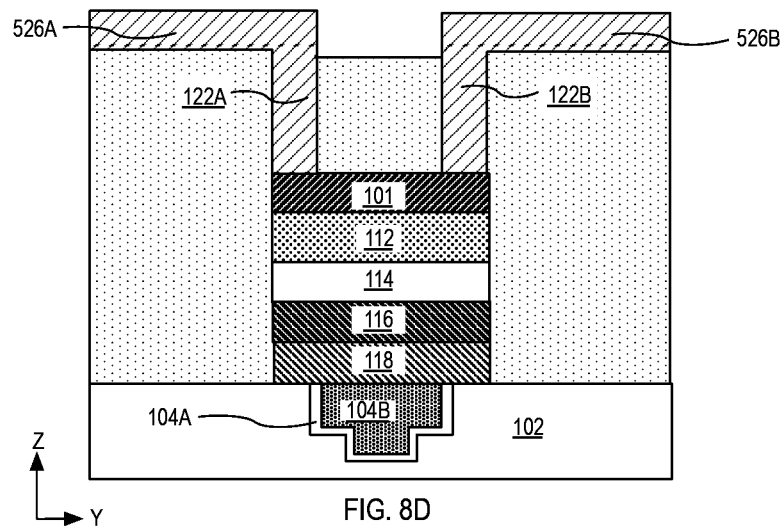
FIG. 8D illustrates a cross section of the structure in FIG. 8C, following the removal of the mask.

FIG. 8D illustrates a cross-sectional view of the structure in FIG. 7C following the removal of mask 527. In an embodiment, a plasma etch process may be utilized to remove the mask 527. In an embodiment, where the mask 527 includes a photolithographic resist, the photolithographic resist is removed by a plasma ashing process. In an embodiment, the plasma ashing process includes reacting the photolithographic resist with an oxygen plasma.

Figure 9A:
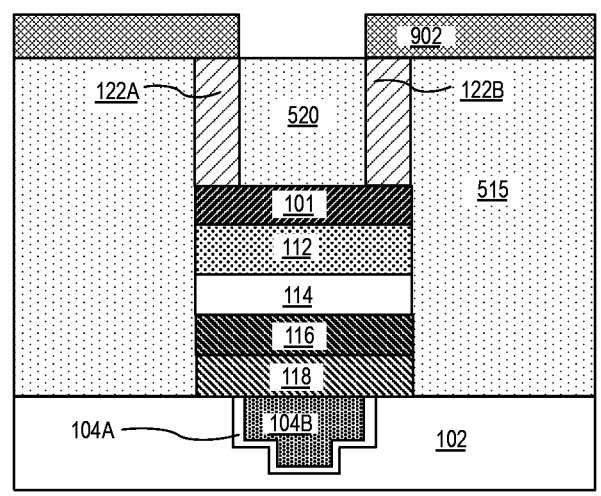
FIG. 9A illustrates a cross-sectional view of the structure of FIG. 7C following the formation of a second conductive interconnect layer selectively on the first contact and on the second contact.

FIG. 9A illustrates a cross-sectional view of the structure of FIG. 7C though a line A-A', following the formation of a conductive interconnect layer 902 selectively on the contacts 122A and 122B, and on the dielectric layer 515. In an embodiment, the dielectric layer 520 includes a material that is different from a material of the dielectric layer 515. In an embodiment, dielectric layer 515 includes a material such as AlN and dielectric layer 515 includes a silicon nitride or a silicon oxide. In some embodiments, an electroless deposition technique may be utilized to deposit the conductive interconnect layer 902 selectively to the dielectric 1 layer 520 between the contacts 122A and 122B. Depending on embodiments, the electroless deposition technique is utilized to selectively deposit a material such as cobalt or tungsten on the contacts 122A and 122B and on the dielectric layer 515. In other embodiments, a chemical vapor deposition process is utilized to deposit a material such as tungsten. In one such embodiment, the tungsten has a thickness between 5 nm-10 nm.

Figure 9B:
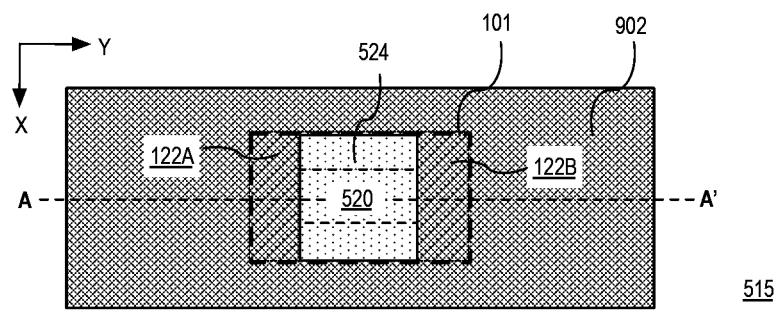
FIG. 9B illustrates a plan-view of the structure in FIG. 9A.

FIG. 9B illustrates a plan-view of the structure in FIG. 9A. The plan view illustration also shows the dielectric layer 524 adjacent to the contacts 122A and 122B. The electroless deposition process, utilized to deposit conductive interconnect layer 902, described above is also selective to dielectric layer 524. In some embodiments, the dielectric layer 524 and 520 include a material such as AlN and the dielectric layer 515 includes silicon oxide. It is to be appreciated that portions of the conductive interconnect layer 902 on the dielectric layer 515 may be removed after the deposition process by a masking and an etching process. In some embodiments, a mask (not shown) may be formed on the conductive interconnect layer 902. The mask may have a foot print that is substantially similar to the footprint of the SOT electrode 101 or a larger footprint than the SOT electrode 101. The mask may be substantially aligned with the SOT electrode 101. The etch process may be utilized to remove portions of the conductive interconnect layer 902 not covered by the mask.

Figure 10:
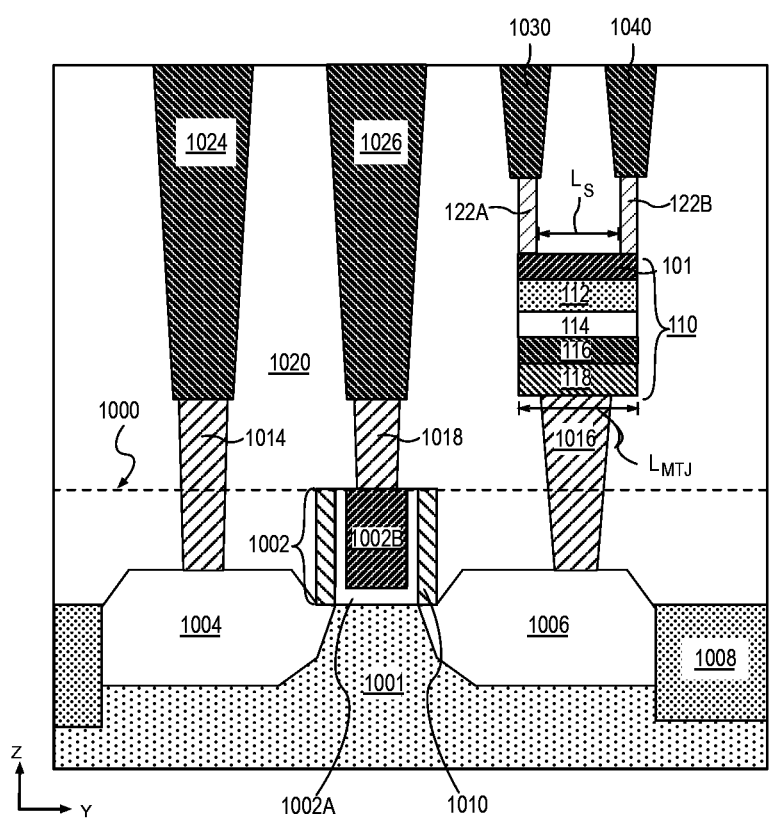
FIG. 10 illustrates a cross-sectional view of a SOT memory device coupled to a drain contact of a transistor.

FIG. 10 illustrates a SOT device coupled to an access transistor 1000. In an embodiment, the SOT memory device 200 includes a MTJ device 110 on a SOT electrode 101, described in association with FIG. 1A. The SOT memory device 100 may include one or more features of the SOT memory device 100 described above in embodiments, associated with FIGS. 1A-1H.

In an embodiment, the MTJ device 110 includes a fixed magnet 116 above the drain contact 1016, a tunnel barrier 114 above the fixed magnet 116, and a free magnet 112 above the tunnel barrier 114. The SOT memory device 100 further includes a SOT electrode 101 above the MTJ device 110 device and coupled with the free magnet 112. The SOT electrode 101 has a substantially same footprint as a footprint of the MTJ device 110. The SOT memory device 100 further includes a first contact 122A over and coupled with a first portion 101A of the SOT electrode 101 and a second contact 122B over and coupled with a second portion 101B of the SOT electrode 101. The contact 122A is laterally distant from the contact 122B by a spacing, $L_S$, that is no more than a length, $L_{MTJ}$, of the MTJ device 110. A lower limit for the spacing, $L_S$, is determined by the spin diffusion length. In current embodiments, the spin diffusion length is between 1 nm and 10 nm. In some embodiments, such as in the embodiment illustrated, the MTJ device 110 further includes a SAF structure 118 between the drain contact and the fixed magnet 116.

In other embodiments (not illustrated), the SOT memory device 100 includes one or more features of contacts 122A and 122B illustrated in the various embodiments in FIG. 1C, 1D or 1E.

In an embodiment, the underlying substrate 1001 represents a surface used to manufacture integrated circuits. Suitable substrate 1001 includes a material such as single crystal silicon, polycrystalline silicon and silicon on insulator (SOI), as well as substrates formed of other semiconductor materials. The substrate 1001 may also include semiconductor materials, metals, dielectrics, dopants, and other materials commonly found in semiconductor substrates.

In an embodiment, the access transistor 1000 associated with substrate 1001 are metal-oxide-semiconductor field-effect transistors (MOSFET or simply MOS transistors), fabricated on the substrate 1001. In various implementations of the invention, the access transistor 1000 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 1000 of substrate 1001 includes a gate 1002. In some embodiments, gate 1002 includes at least two layers, a gate dielectric layer 1002A and a gate electrode 1002B. The gate dielectric layer 1002A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1002A to improve its quality when a high-k material is used.

The gate electrode 1002B of the access transistor 1000 of substrate 1001 is formed on the gate dielectric layer 1002A and may consist of at least one P-type workfunction metal or N-type workfunction metal, depending on whether the transistor is to be a PMOS or an NMOS transistor. In some implementations, the gate electrode 1002B may consist of a stack of two or more metal layers, where one or more metal layers are workfunction metal layers and at least one metal layer is a conductive fill layer.

For a PMOS transistor, metals that may be used for the gate electrode 1002B include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1002B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 1002B may consist of one or more U-shaped metal layers formed atop one or more planar, non-U-shaped layers.

In some implementations of the invention, a pair of sidewall spacers 1010 are on opposing sides of the gate 1002 that bracket the gate stack. The sidewall spacers 1010 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 1004 and drain region 1006 are formed within the substrate adjacent to the gate stack of each MOS transistor. The source region 1004 and drain region 1006 are generally formed using either an implantation/diffusion process or an etching/deposition process. In the former process, dopants such as boron, aluminum, antimony, phosphorous, or arsenic may be ion-implanted into the substrate to form the source region 1004 and drain region 1006. An annealing process that activates the dopants and causes them to diffuse further into the substrate typically follows the ion implantation process.

In the latter process, the substrate 1001 may first be etched to form recesses at the locations of the source and drain regions. An epitaxial deposition process may then be carried out to fill the recesses with material that is used to fabricate the source region 1004 and drain region 1006. In some implementations, the source region 1004 and drain region 1006 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1004 and drain region 1006 may be formed using one or more alternate semiconductor materials such as germanium or a group III-V material or alloy. And in further embodiments, one or more layers of metal and/or metal alloys may be used to form the source region 1004 and drain region 1006. In the illustrative embodiment, an isolation 1008 is adjacent to the source region 1004, drain region 1006 and portions of the substrate 1001.

In an embodiment, a source contact 1014 and a drain contact 1016 are formed in a dielectric layer 1011 and in the dielectric layer 1012 above the gate electrode 1002B. In the illustrative embodiment, a source metallization structure 1024 is coupled with the source contact 1014 and a gate metallization structure 1026 is coupled with the gate contact 1018. In the illustrated embodiment, a dielectric layer 1020 is adjacent to the gate contact 1018, drain contact 1016, source contact 1014 and portions of the source metallization structure 1024 and the gate metallization structure 1026.

In the illustrative embodiment, an interconnect metallization 1030 is over and coupled with the contact 122A and an interconnect metallization 1040 is over and coupled with the contact 122B. In some embodiments, interconnect metallization 1030 may be connected to a drain terminal of a second transistor (not shown) and the interconnect metallization 1040 may be connected to a bit line (not shown).

In an embodiment, the source contact 1014, the drain contact 1016 and gate contact 1018 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 1008 and dielectric layer 1020 may include any material that has sufficient dielectric strength to provide electrical isolation such as, but not, limited silicon dioxide, silicon nitride, silicon oxynitride, carbon doped nitride and carbon doped oxide.

Figure 11:
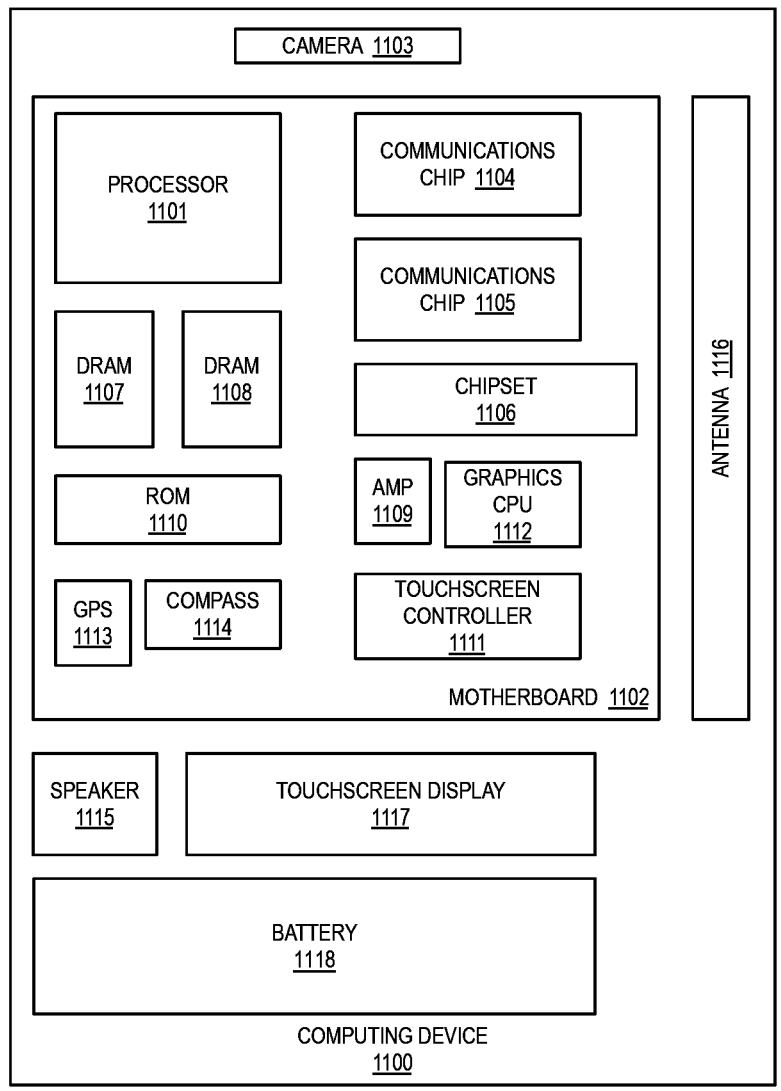
FIG. 11 illustrates a computing device in accordance with embodiments of the present disclosure.

FIG. 11 illustrates a computing device 1100 in accordance with embodiments of the present disclosure. As shown, computing device 1100 houses a motherboard 1102. Motherboard 1102 may include a number of components, including but not limited to a processor 1101 and at least one communication chip 1105. Processor 1101 is physically and electrically coupled to the motherboard 1102. In some implementations, communication chip 1105 is also physically and electrically coupled to motherboard 1102. In further implementations, communication chip 1105 is part of processor 1101.

Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset 1106, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1105 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1105 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communication chips 1104 and 1105. For instance, a first communication chip 1105 may be dedicated to shorter range wireless communications such as Wi-Fi and Bluetooth and a second communication chip 1104 may be dedicated to longer range wireless communications such as GPS, EDGE, GPRS, CDMA, WiMAX, LTE, Ev-DO, and others.

Processor 1101 of the computing device 1100 includes an integrated circuit die packaged within processor 1101. In some embodiments, the integrated circuit die of processor 1101 includes a transistor coupled with one at least one SOT memory device such as a SOT memory device 100 including a MTJ device 110 on a SOT electrode 101. The term "processor" may refer to any device or portion of a device that processes electronic data from registers and/or memory to transform that electronic data into other electronic data that may be stored in registers and/or memory.

Communication chip 1105 also includes an integrated circuit die packaged within communication chip 1106. In another embodiment, the integrated circuit die of communication chips 1104, 1105 include a memory array with memory cells including a SOT memory device 100 including a MTJ device 110 on a SOT electrode 101.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics CPU 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1100 and discussed above may contain a stand-alone integrated circuit memory die that includes one or more arrays of memory cells including at least one SOT memory device 100, built in accordance with embodiments of the present disclosure.

In various implementations, the computing device 1100 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
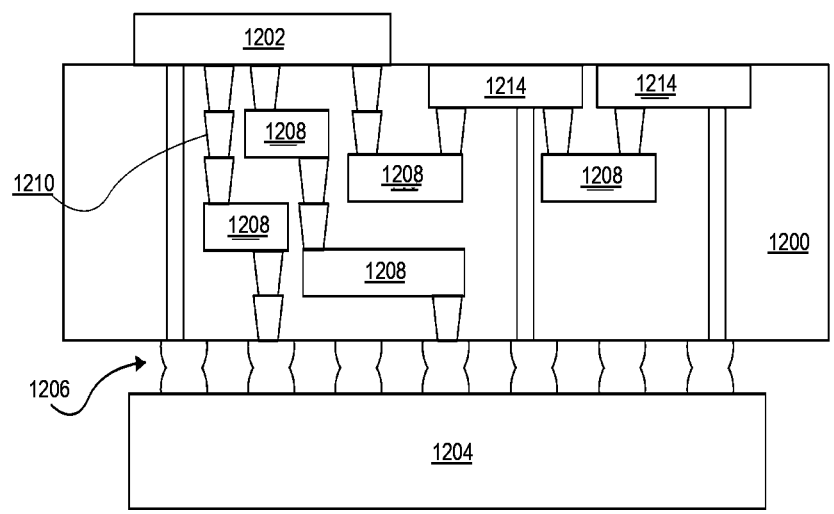
FIG. 12 illustrates an integrated circuit (IC) structure that includes one or more embodiments of the present disclosure.

FIG. 12 illustrates an integrated circuit structure 1200 that includes one or more embodiments of the disclosure. The integrated circuit (IC) structure 1200 is an intervening structure used to bridge a first substrate 1202 to a second substrate 1204. The first substrate 1202 may be, for instance, an integrated circuit die. The second substrate 1204 may be, for instance, a memory module, a computer mother, or another integrated circuit die. The integrated circuit structure 1200 may include one or more device systems such as a device structure including a transistor coupled with at least one SOT memory device such as a SOT memory device 100. Generally, the purpose of an integrated circuit (IC) structure 1200 is to spread a connection to a wider pitch or to reroute a connection to a different connection. For example, an integrated circuit (IC) structure 1200 may couple an integrated circuit die to a ball grid array (BGA) 1206 that can subsequently be coupled to the second substrate 1204. In some embodiments, the first and second substrates 1202/1204 are attached to opposing sides of the integrated circuit (IC) structure 1200. In other embodiments, the first and second substrates 1202/1204 are attached to the same side of the integrated circuit (IC) structure 1200. And in further embodiments, three or more substrates are interconnected by way of the integrated circuit (IC) structure 1200.

The integrated circuit (IC) structure 1200 may be formed of an epoxy resin, a fiberglass-reinforced epoxy resin, a ceramic material, or a polymer material such as polyimide. In further implementations, the integrated circuit (IC) structure 1200 may be formed of alternate rigid or flexible materials that may include the same materials described above for use in a semiconductor substrate, such as silicon, germanium, and other group III-N, group III-V and group IV materials. The integrated circuit (IC) structure 1200 may include metal interconnects 1208 and via 1210, including but not limited to through-silicon vias (TSVs) 1210. The integrated circuit (IC) structure 1200 may further include embedded devices 1214, including both passive and active devices. Such devices include, but are not limited to, capacitors, decoupling capacitors, resistors, inductors, fuses, diodes, transformers, device structure including a transistor coupled with at least one SOT memory device, such as SOT memory device 100, for example, one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1200. In accordance with embodiments of the present disclosure, apparatuses or processes disclosed herein may be used in the fabrication of integrated circuit (IC) structure 1200.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of SOT memory device. Such a SOT memory device may be used in an embedded non-volatile memory application.

Specific embodiments are described herein with respect to a SOT memory device including a MTJ device. It is to be appreciated that embodiments described herein may also be applicable to in-plane MTJ devices including in-plane spin torque transfer memory (STTM) devices and perpendicular MTJ devices including spin torque transfer memory (STTM) devices.

Thus, embodiments of the present disclosure include SOT memory devices with self-aligned contacts and their methods of fabrication.

What is claimed is:

1. A non-volatile spin orbit torque (SOT) memory device, comprising: a magnetic tunnel junction (MTJ) device over a conductive interconnect structure, the MTJ device comprising: a free magnet; a fixed magnet; and a tunnel barrier between the free magnet and the fixed magnet, wherein the fixed magnet is adjacent the conductive interconnect structure; an electrode on the free magnet of the MTJ device, wherein the electrode comprises a spin orbit torque material, and a sidewall of the electrode, of the tunnel barrier, of the magnet, and of the fixed magnet are aligned and form a common sidewall; a first contact on a first portion of the electrode adjacent the common sidewall; and a second contact on a second portion of the electrode, wherein the first contact is laterally distant from the second contact by an amount no more than a length of the MTJ device.

2. The non-volatile SOT memory device of claim 1, wherein the first contact comprises an outer sidewall that does not extend beyond the common sidewall and the second contact comprises an outer sidewall that does not extend beyond a second common sidewall of the MTJ device and the electrode.

3. The non-volatile SOT memory device of claim 1, wherein the first contact and the second contact each has a width between 5 nm and 10 nm and the MTJ device has a length between 20 nm and 100 nm.

4. The non-volatile SOT memory device of claim 3, wherein the first contact is laterally distant from the second contact by an amount between 10 nm and 90 nm.

5. The non-volatile SOT memory device of claim 1, wherein the first contact comprises a sidewall that extends beyond the common sidewall and the second contact comprises a sidewall that extends beyond a second common sidewall of the MTJ device and the electrode.

6. The non-volatile SOT memory device of claim 5, wherein the first contact extends beyond the common sidewall by an amount between 25% and 50% of a width of the first contact and the second contact extends beyond the second common sidewall by an amount between 25% and 50% of a width of the second contact.

7. The non-volatile SOT memory device of claim 5, wherein the first contact further extends below an uppermost surface of the electrode, but above a lowermost surface of the electrode, and wherein the second contact extends below the uppermost surface, but above the lowermost surface.

8. The non-volatile SOT memory device of claim 1, wherein the first contact has a height from the electrode that is between 1 and 10 times a width of the first contact and wherein the second contact has a height from the electrode that is between 1 and 10 times a width of the second contact.

9. The non-volatile SOT memory device of claim 1, wherein the MTJ device further comprises a synthetic antiferromagnetic structure between the fixed magnet and the conductive interconnect.

10. The non-volatile SOT memory device of claim 1, further comprising a second SOT device having a third contact and fourth contact, wherein the first contact or the second contact is electrically coupled with the third contact or the fourth contact of the second SOT device by a conductive interconnect.

11. A spin orbit torque (SOT) device, comprising:
a magnetic tunnel junction (MTJ) device over a conductive interconnect structure, the MTJ comprising a free magnet, a fixed magnet, and a tunnel barrier between the free magnet and the fixed magnet;
an electrode above the MTJ device and coupled with the free magnet, wherein the electrode comprises a spin orbit torque material;
a first contact over and coupled with a first portion of the electrode; and
a second contact over and coupled with a second portion of the electrode, wherein the first contact is laterally distant from the second contact by no more than a length of the MTJ device, wherein the first contact comprises a sidewall that extends beyond a sidewall of the first portion of the electrode by an amount between 25% and 50% of a width of the first contact and the second contact comprises a sidewall that extends beyond a sidewall of the second portion of the electrode by an amount between 25% and 50% of a width of the second contact.

12. The SOT device of claim 11, wherein the first contact and the second contact each has a width between 5 nm and 10 nm and the MTJ device has a length between 20 nm and 100 nm.

13. The SOT device of claim 11, wherein the first contact is laterally distant from the second contact by an amount between 10 nm and 90 nm.

14. The SOT device of claim 11, wherein the first contact has a height from the electrode that is between 1 and 10 times a width of the first contact and wherein the second contact has a height from the electrode that is between 1 and 10 times a width of the second contact.

15. The SOT device of claim 11, wherein the first contact further extends below an uppermost surface of the electrode, but above a lowermost surface of the electrode, and wherein the second contact extends below the uppermost surface, but above the lowermost surface.

16. The SOT device of claim 11, wherein the MTJ device further comprises a synthetic antiferromagnetic structure between the fixed magnet and the conductive interconnect.

17. The SOT device of claim 11, further comprising a second SOT device having a third contact and fourth contact, wherein the first contact or the second contact of the SOT device is electrically coupled with the third contact or the fourth contact of the second SOT device by a conductive interconnect.

18. A spin orbit torque (SOT) device, comprising:
a magnetic tunnel junction (MTJ) device over a conductive interconnect structure, the MTJ comprising a free magnet, a fixed magnet, and a tunnel barrier between the free magnet and the fixed magnet;
an electrode above the MTJ device and coupled with the free magnet, wherein the electrode comprises a spin orbit torque material;
a first contact over and coupled with a first portion of the electrode; and
a second contact over and coupled with a second portion of the electrode, wherein the first contact is laterally distant from the second contact by no more than a length of the MTJ device, wherein the first contact comprises a sidewall that extends beyond a sidewall of the first portion of the electrode and the second contact comprises a sidewall that extends beyond a sidewall of the second portion of the electrode, and wherein the first contact extends below an uppermost surface of the electrode adjacent to the sidewall of the first portion of the electrode, but above a lowermost surface of the electrode, and wherein the second contact extends below an uppermost surface of the electrode adjacent to the sidewall of the second portion of the electrode, but above the lowermost surface of the electrode.

19. The SOT device of claim 18, wherein the first contact and the second contact each has a width between 5 nm and 10 nm and the MTJ device has a length between 20 nm and 100 nm.

20. The SOT device of claim 18, wherein the first contact is laterally distant from the second contact by an amount between 10 nm and 90 nm.

21. The SOT device of claim 18, wherein the first contact extends beyond the sidewall of the first portion of the electrode by an amount between 25% and 50% of a width of the first contact and the second contact extends beyond the sidewall of the second portion of the electrode by an amount between 25% and 50% of a width of the second contact.

22. The SOT device of claim 18, wherein the first contact has a height from the electrode that is between 1 and 10 times a width of the first contact and wherein the second contact has a height from the electrode that is between 1 and 10 times a width of the second contact.

23. The SOT device of claim 18, wherein the MTJ device further comprises a synthetic antiferromagnetic structure between the fixed magnet and the conductive interconnect.

24. The SOT device of claim 18, further comprising a second SOT device having a third contact and fourth contact, wherein the first contact or the second contact of the SOT device is electrically coupled with the third contact or the fourth contact of the second SOT device by a conductive interconnect.

* * * * *